(12) United States Patent
Hsu et al.

(10) Patent No.: US 12,354,884 B2
(45) Date of Patent: Jul. 8, 2025

(54) METHOD FOR MAKING A PACKAGING SUBSTRATE

(71) Applicant: Taiwan Semiconductor Manufacturing Company Limited, Hsinchu (TW)

(72) Inventors: Kuo-Ching Hsu, Chung-Ho (TW); Shyue-Ter Leu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 316 days.

(21) Appl. No.: 17/863,690

(22) Filed: Jul. 13, 2022

(65) Prior Publication Data

US 2024/0021437 A1    Jan. 18, 2024

(51) Int. Cl.
| | |
|---|---|
| *H01L 21/48* | (2006.01) |
| *C25D 5/02* | (2006.01) |
| *C25D 5/10* | (2006.01) |
| *C25D 7/12* | (2006.01) |
| *G03F 7/00* | (2006.01) |
| *H01L 23/498* | (2006.01) |

(52) U.S. Cl.
CPC .......... *H01L 21/4857* (2013.01); *C25D 5/022* (2013.01); *C25D 5/10* (2013.01); *C25D 7/123* (2013.01); *G03F 7/0035* (2013.01); *H01L 23/49822* (2013.01); *H01L 23/49827* (2013.01); *H01L 23/49866* (2013.01)

(58) Field of Classification Search
CPC .......... C25D 5/022; C25D 5/10; C25D 7/123; G03F 7/0035; H01L 21/4857; H01L 21/486; H01L 23/49822; H01L 23/49827; H01L 23/49838; H01L 23/49866
See application file for complete search history.

(56) References Cited

U.S. PATENT DOCUMENTS

| | | | | |
|---|---|---|---|---|
| 11,532,561 | B2* | 12/2022 | Lin | H01L 23/5226 |
| 11,824,010 | B2* | 11/2023 | Fay | H01L 21/4857 |
| 2015/0026975 | A1* | 1/2015 | Kariya | H05K 1/0271 |
| | | | | 29/852 |
| 2016/0126174 | A1* | 5/2016 | Shen | H01L 23/49827 |
| | | | | 174/262 |
| 2024/0021437 | A1* | 1/2024 | Hsu | H01L 23/49822 |

* cited by examiner

*Primary Examiner* — Minh N Trinh
(74) *Attorney, Agent, or Firm* — The Marbury Law Group, PLLC

(57) ABSTRACT

A packaging substrate fabrication process is provided. A substrate plate including through-plate metal via structures is provided. At least one interconnect-level structure may be formed by performing a unit sequence of processing steps that includes: a metal seed deposition step; a first masking step; a first electroplating step that forms metal lines; a second masking step; a second electroplating step that forms metal via structures; a seed layer etch step; a dielectric material deposition step that forms a dielectric material layer; and a planarization step that removes portions of the dielectric material layer that are more distal from the substrate plate than distal horizontal surfaces of the metal via structures. Laser drilling processing steps are not necessary during manufacture of the packaging substrate.

20 Claims, 33 Drawing Sheets

METHOD FOR MAKING A PACKAGING SUBSTRATE

BACKGROUND

Packaging substrates are used as intermediate structures for attaching semiconductor dies to a printed circuit board. Manufacture of packaging substrates typically imposes many processing constraints such as tight process control between laser drilling and copper plating. Further, high-aspect-ratio via plating processes and low-power laser drilling processes may be necessary as the number of layers in packaging substrates increases due to the need for high performance computing (HPC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
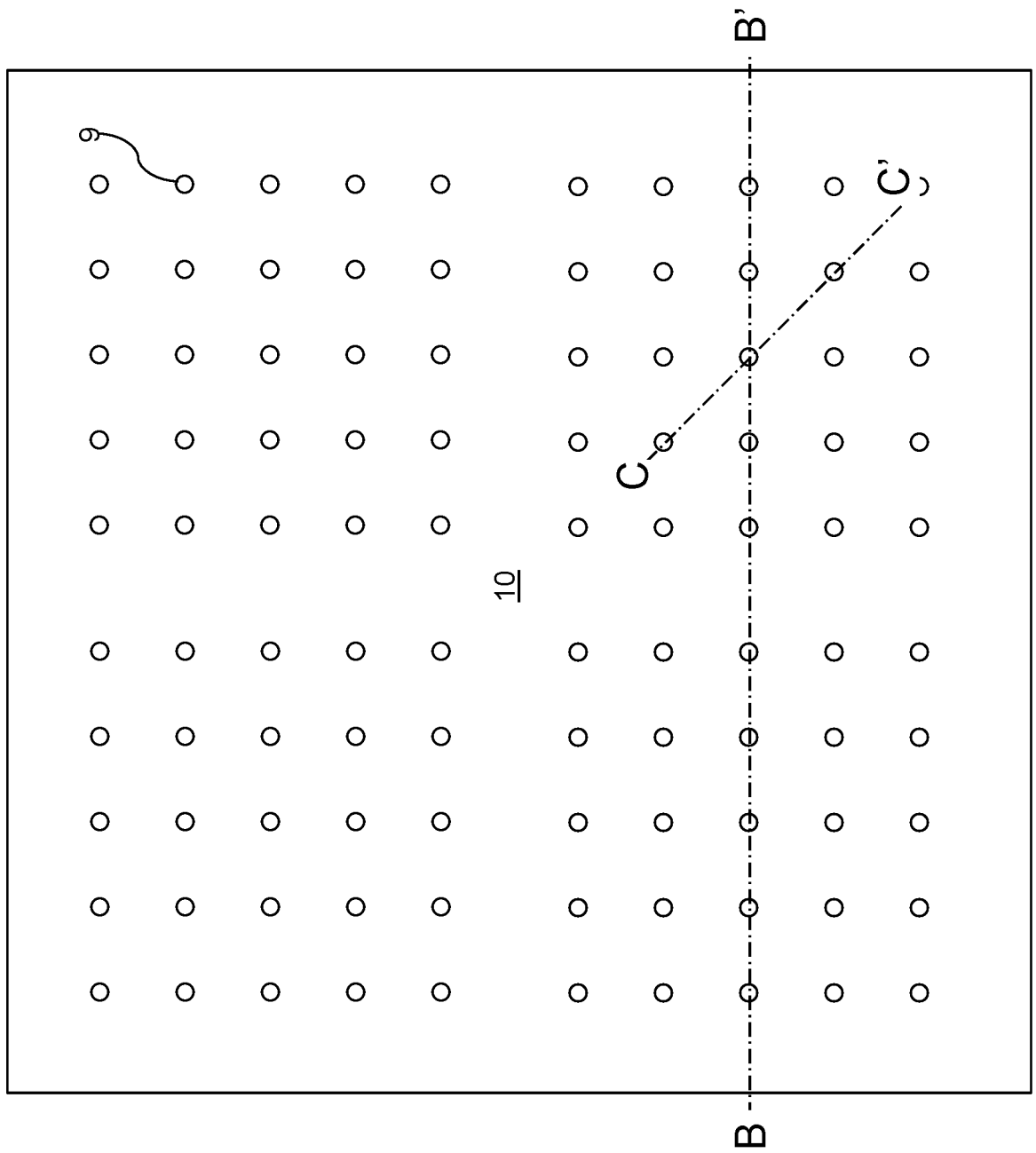
FIG. 1A is a top-down view of an exemplary structure including a substrate plate after formation of through-plate holes according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range. Ordinals such as "first," "second," "third," etc. are not an inherent part of a name of any element, and are used only for the purpose of individually identifying multiple elements having the same, or similar, characteristics, and thus, different ordinals may be used for a same element across the specification and the claims. For example, a second element in the specification may be referred to as a first element in the claims.

The present disclosure is directed to a packaging substrate and a manufacturing process for the same. Some packaging substrates use an Ajinomoto Build-Up Film® (ABF) as an insulating material for high-performance semiconductors. During manufacture of packaging substrates, laser drilling processes may be used to form via cavities through dielectric material layers. However, use of laser drilling processes requires tight processing control in accompanying processing steps. For example, the queue time between a laser drilling process and a copper plating process is limited to maintain the quality of copper plating. Further, high aspect ratio via cavities formed by laser drilling process require a superfill copper plating process to avoid formation of cavities in electroplated copper via portions. In addition, high performance computing applications often require reduction in the laser power. Thus, an alternative manufacture process for a packaging substrate is desired. The various embodiments disclosed herein may utilize a variety of metal materials to form the various vias and lines. For example, gold, copper, or any conductive metal may be used.

The present disclosure provides a new packaging substrate and a method for forming the same. Specifically, a laser-less manufacturing process is used to form a packaging substrate. A combination of a line plating process, a vial plating process, a dielectric material deposition process, and a planarization process may be used to form an interconnect-level structure. A front interconnect-level structure and a backside interconnect-level structure may be formed simultaneously over a substrate plate. The various aspects of embodiments of the present disclosure are now described with reference to accompanying drawings.

Figure 1B:
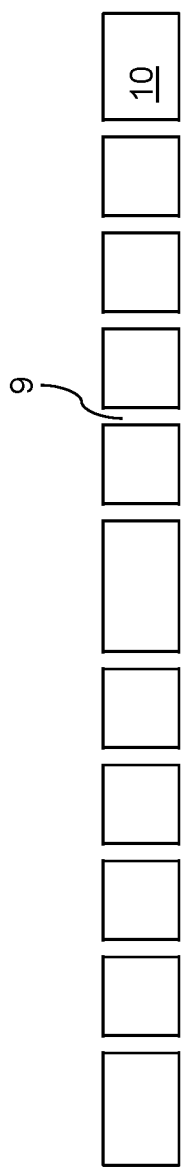
FIG. 1B is a vertical cross-sectional view of the exemplary structure along the vertical plane B-B' of FIG. 1A.
Figure 1C:
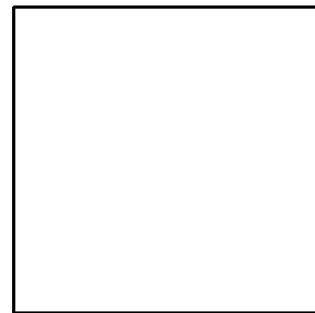
FIG. 1C is a vertical cross-sectional view of the exemplary structure along the vertical plane C-C' of FIG. 1A.
Figure 1C:
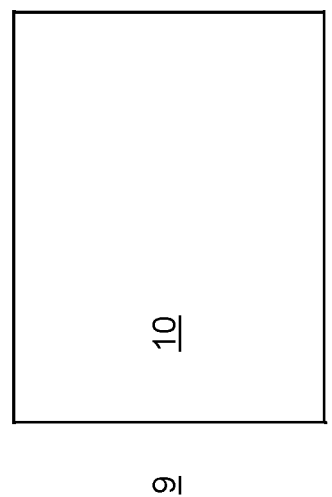
Figure 1C:
Figure 1C:
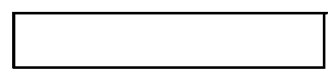

Referring to FIGS. 1A-1C, a substrate plate 10 for forming a packaging substrate is illustrated after formation of through-plate holes 9. The substrate plate 10 includes at least one insulating material. The at least one insulating material in the substrate plate 10 may include any insulating material that provides sufficient mechanical strength, sufficient matching in the coefficient of thermal expansion with respect to at least one interposer and/or at least one semiconductor die to be mounted, and suitable level of electrical isolation. The substrate plate 10 may comprise, and/or may consist essentially of, at least one dielectric polymer material and/or at least one ceramic material. In a non-limiting illustrative example, the substrate plate 10 may comprise an Ajinomoto Build-up Film® (ABF) that includes a three-layer polymer stack containing a polyethylene terephthalate (PET) support film, a resin layer, and a cover film. The thickness of the substrate plate 10 may be in a range from 60 microns to 300 microns, although lesser and greater thicknesses may also be used.

Generally, the substrate plate 10 may be formed as a sheet that provides formation of a plurality of packaging substrates thereupon. The plurality of packaging substrate may be formed as a two-dimensional periodic array of packaging substrates, which may be singulated upon dicing to provide a plurality of discrete packaging substrate. While the present disclosure is described with illustrations of the area for a single packaging substrate or of a smaller area within the area for a single packaging substrate, it is understood that an actual manufacturing process may manufacture a plurality of packaging substrate simultaneously on a continuous sheet that embodies the substrate plates 10 for a plurality of packaging substrates.

Generally, the through-plate holes 9 may be formed by any known method in the art. For example, the through-plate holes 9 may be formed by mechanical drilling. The total number of through-plate holes 9 depends on the application for which the packaging substrate is to be used. The total number of through-substrate holes 9 per packaging substrate 9 may be, for example, in a range from 100 to $1.0 \times 10^8$, although lesser and greater number of through-substrate holes 9 may also be used. The horizontal cross-sectional shape of each through-substrate 9 may be a circle, or any other suitable two-dimensional shape. A lateral dimension of each through-substrate hole 9, such as a diameter, may be in a range from 3 microns to 100 microns, although lesser and greater lateral dimensions may also be used.

Figure 2A:
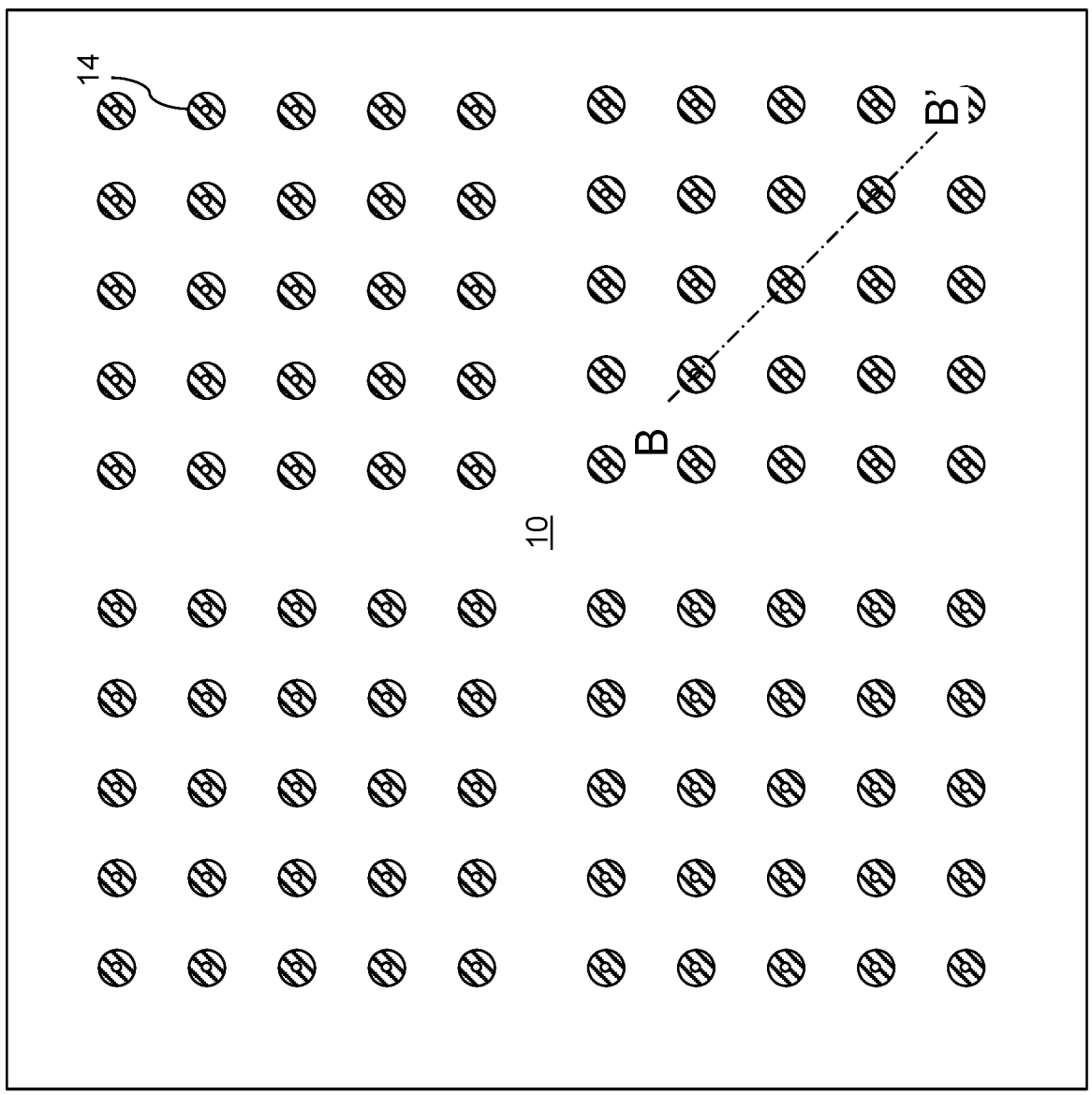
FIG. 2A is a top-down view of the exemplary structure after formation of through-plate metal via structures (e.g., copper via structures) according to an embodiment of the present disclosure.
Figure 2B:
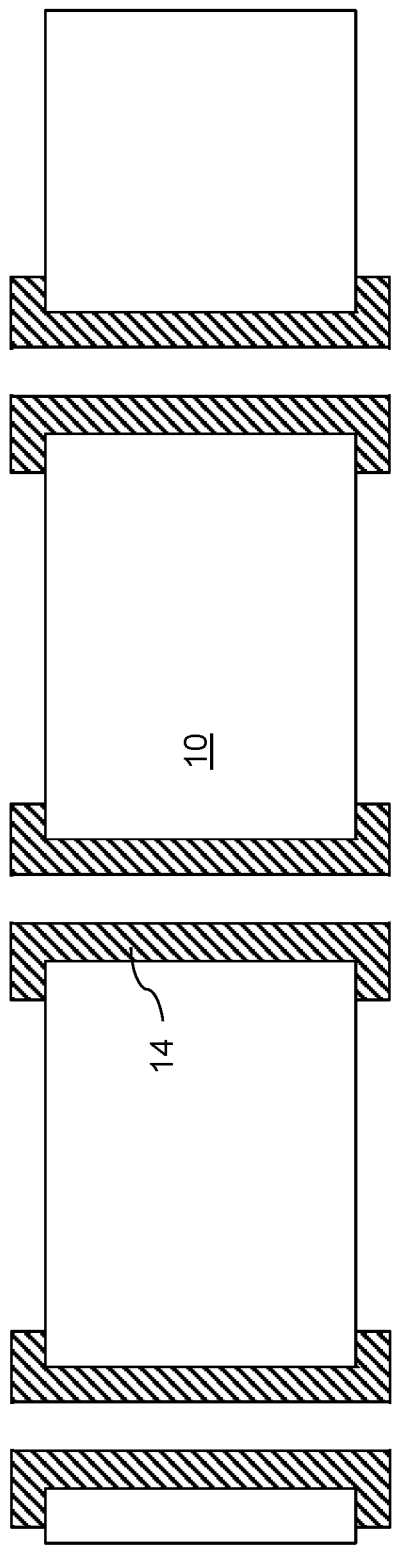
FIG. 2B is a vertical cross-sectional view of the exemplary structure along the vertical plane B-B' of FIG. 2A.

Referring to FIGS. 2A and 2B, through-plate metal via structures 14 (e.g., through-plate copper via structures) may be formed in the through-plate holes 9 and segments of horizontal surfaces of the substrate plate 10 that are proximal to the through-plate holes 9. In an illustrative example, a metallic seed layer such as a copper seed layer may be conformally deposited on the physically exposed surfaces of the substrate plate 10. Photoresist layers may be formed on the front horizontal surface and on the backside horizontal surface of the substrate plate 10, and may be lithographically patterned to form openings around each through-plate hole. A metal electroplating process may be performed to electroplate metal on physically exposed surfaces of the metallic seed layer that are not covered by the photoresist layers. The photoresist layers may be subsequently removed, and portions of the metallic seed layer that are not covered by the electroplated (e.g., copper) portions may be removed by performing an etch process, which may use a wet etch process or a dry etch process. Each contiguous combination of a remaining portion of the metallic seed layer and an electroplated metal portion constitutes a through-plate metal via structure 14. A through-plate metal via structure 14 may comprise a cylindrical cavity 15 therein, or may be free of a cylindrical cavity depending on the thickness of the electroplated metal portions. Each through-plate metal via structure 14 comprises front flange portion located on a front surface of the substrate plate 10 and a backside flange portion located on a backside of the substrate plate 10. The flange portions of each through-plate metal via structure 14 may have a greater lateral dimension than a vertically-extending portion of the through-plate metal via structure 14 that extends through the substrate plate 10. In one embodiment, each flange portion of the through-plate metal via structures 14 may have a horizontal cross-sectional shape of an annulus. In one embodiment, the thickness of the flange portions of the through-plate metal via structures 14 may be in a range from 1 micron to 30 microns, such as from 3 microns to 10 microns, although lesser and greater thicknesses may also be used.

Figure 3:
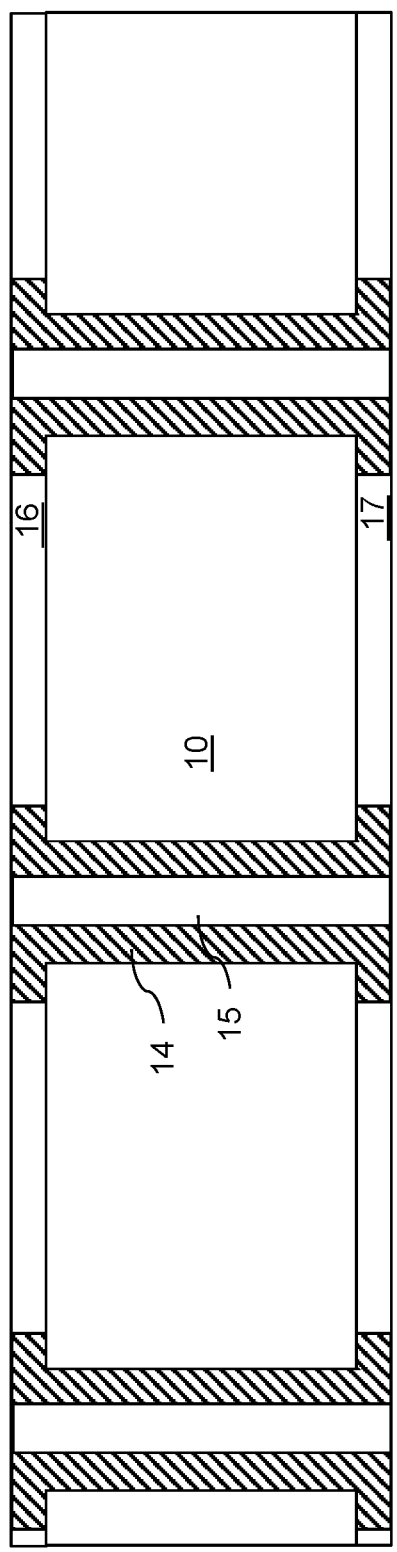
FIG. 3 is a vertical cross-sectional view of a region of the exemplary structure after formation of a front cover dielectric layer and a backside cover dielectric layer according to an embodiment of the present disclosure.

Referring to FIG. 3, cover dielectric layers (16, 17) may be formed over the substrate plate 10. The cover dielectric layers (16, 17) may comprise a front cover dielectric layer 16 and a backside cover dielectric layer 17. The cover dielectric layers (16, 17) may comprise an inorganic material such as silicon oxide or silicon nitride, or a polymer material such as epoxy, resin, polyimide (PI), benzocyclobutene (BCB), polybenzobisoxazole (PBO), or polyethylene terephthalate (PET). The cover dielectric layers (16, 17) may be subsequently planarized, for example, by grinding or polishing, such that a physically exposed distal horizontal surface of the front cover dielectric layer 16 is coplanar with physically exposed front end surfaces of the through-plate.

Referring to FIGS. 3-12C, a unit sequence of processing steps may be performed to form interconnect-level structures, which may include a first front interconnect-level structure and a first backside interconnect-level structure. The unit sequence of processing steps may comprise, for example, a desmear step, a metal seed deposition step such as copper seed deposition step (which may comprise an electroless plating process step), a first lithographic patterning step that forms patterned electroplating mask layers, a first electroplating step that forms metal lines, a first photoresist strip step, a second lithographic patterning step that forms patterned electroplating mask layers, a second electroplating step that forms metal via structures, a second photoresist strip step, a metal seed layer etch step, a lamination step that deposits dielectric material layers, and a planarization process step that removes portions of the dielectric material layers that protrude farther than distal planar surfaces of the metal via structures by polishing or grinding. The unit sequence of processing steps may be subsequently repeated with a suitable change in the lithographic patterns to form additional interconnect-level structures.

Figure 4:
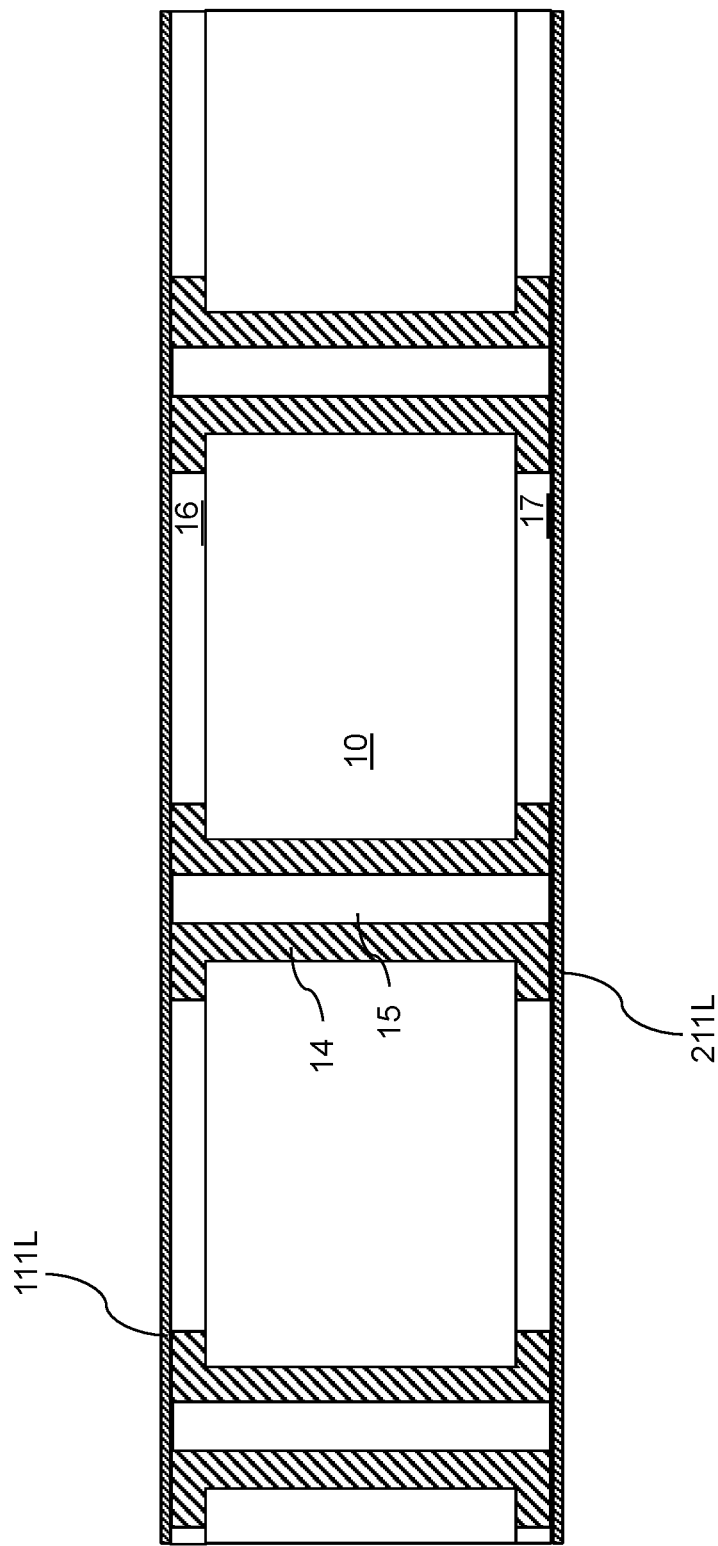
FIG. 4 is a vertical cross-sectional view of a region of the exemplary structure after formation of a first front metal seed layer (e.g., first front copper seed layer) and a first backside metal seed layer e.g., first backside copper seed layer) according to an embodiment of the present disclosure.

Referring to FIG. 4, a desmear process may be performed to remove any dielectric material of the cover dielectric layers (16, 17) that is smeared on physically exposed metal surfaces, such as the physically exposed end surfaces of the through-substrate metal via structures 14.

A metal seed deposition step may be performed to deposits a metal seed layer on each side of the substrate plate 10. The metal seed deposition step deposits the metal seed layer on physically exposed surfaces of metal portions attached to the substrate plate 10. The physically exposed surfaces of the metal portions attached to the substrate plate 10 comprise physically exposed surface of the through-plate metal via structures 14. In one embodiment, the metal seed deposition step that deposits the metal seed layer comprises a metal electroless plating process.

Generally, a first front metal seed layer 111L may be deposited on a front patterned surface in which discrete front metal surfaces (such as front end surfaces of the through-substrate metal via structures 14) are exposed within a first horizontal plane including a front surface of a first dielectric material layer such as the front cover dielectric layer 16. Likewise, a first backside metal seed layer 211L may be deposited on a backside patterned surface in which discrete backside metal surfaces (such as backside end surfaces of the through-substrate metal via structures 14) are exposed within a second horizontal plane including a backside surface of a second dielectric material layer (such as a backside cover dielectric layer 17).

In one embodiment, the first front metal seed layer 111L may be deposited on a front side of the substrate plate 10 and the first backside metal seed layer 211L on the backside of the substrate plate 10. In one embodiment, the first front metal seed layer 111L may be deposited on front surfaces of the through-plate metal via structures 14, and the first backside metal seed layer 211L may be deposited on backside surfaces of the through-plate metal via structures 14. The thickness of each of the first front metal seed layer 111L and the first backside metal seed layer 211L may be in a range from 200 nm to 800 nm, although lesser and greater thicknesses may also be used.

Figure 5A:
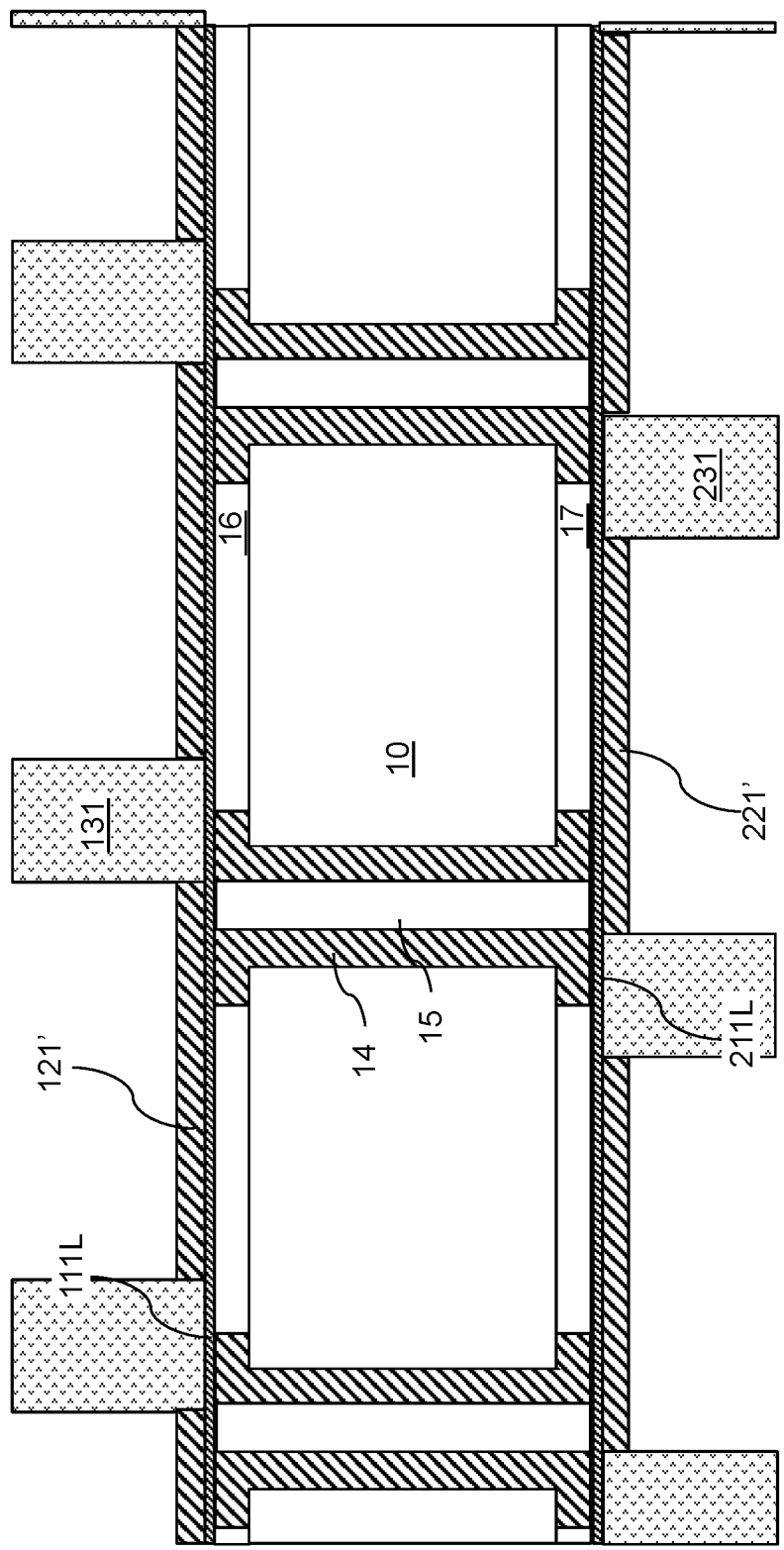
FIG. 5A is a vertical cross-sectional view of a region of the exemplary structure after formation of a first front patterned electroplating mask layer, a first backside patterned electroplating mask layer, first in-process front metal lines (e.g., first in-process front copper lines), and first in-process backside metal lines (e.g., first in-process backside copper lines) according to an embodiment of the present disclosure.
Figure 5B:
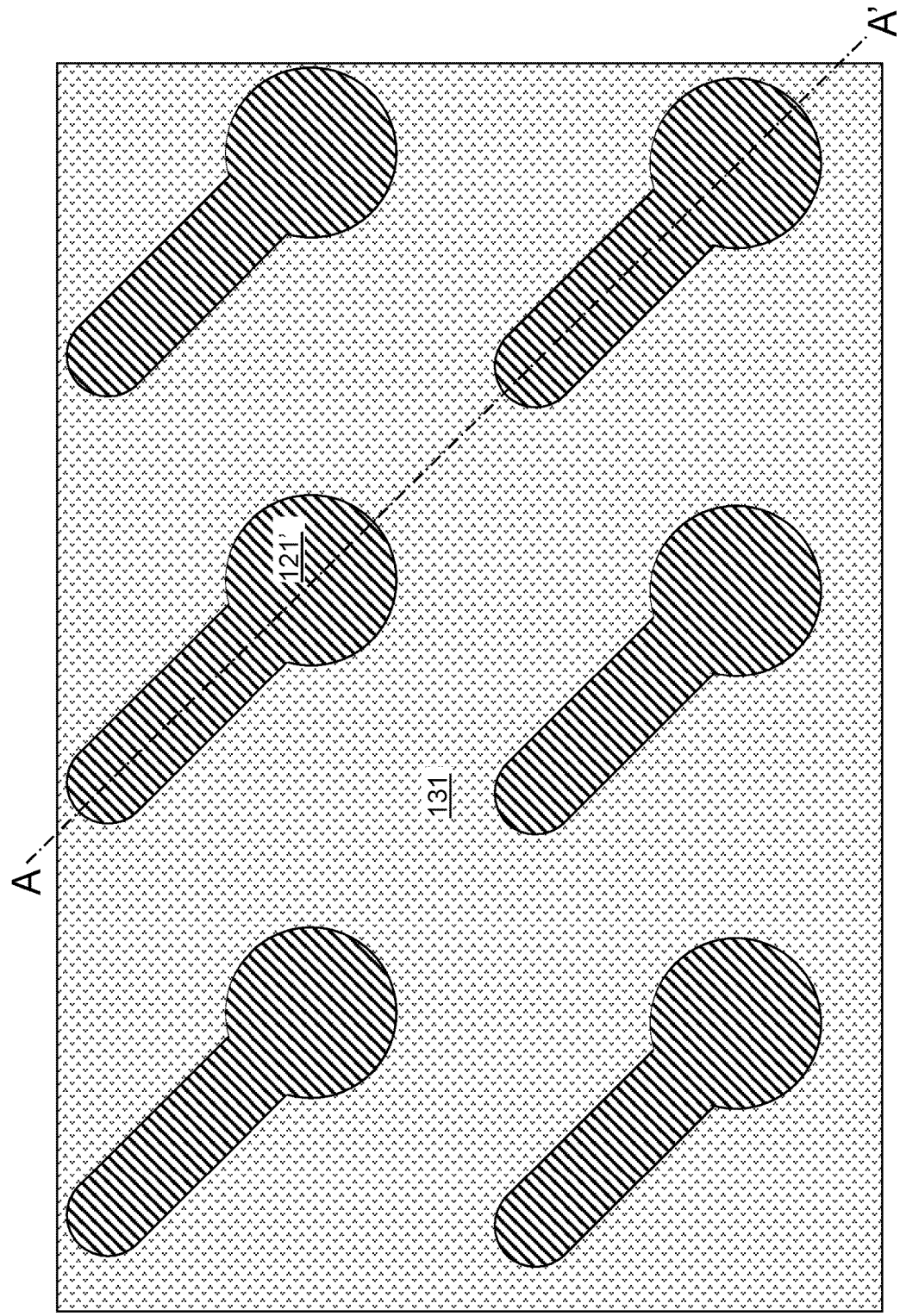
FIG. 5B is a top-down view of the region of the exemplary structure of FIG. 5A, wherein the vertical cross-sectional view in FIG. 5A is along line AA' in FIG. 5B.

Referring to FIGS. 5A and 5B, a first lithographic patterning step may be performed to form patterned electroplating mask layers, which may include a first front patterned electroplating mask layer 131 and a first backside patterned electroplating mask layer 231. In one embodiment, the first front patterned electroplating mask layer 131 may be formed by attaching a first dry film including a first photoresist material layer to the first front metal seed layer 111L, and by lithographically exposing and developing the first photoresist material layer to form openings in areas in which front metal lines are to be subsequently formed. Likewise, the first backside patterned electroplating mask layer 231 may be formed by attaching a second dry film including a second photoresist material layer to the first backside metal seed layer 211L, and by lithographically exposing and developing the second photoresist material layer to form openings in areas in which backside metal lines are to be subsequently formed. In one embodiment, areas of openings in the first front patterned electroplating mask layer 131 and the first backside patterned electroplating mask layer 231 may have an overlap with an area of a respective one of the flange portions of the through-substrate metal via structures 14.

A first electroplating step may be performed to electroplate metal (e.g., copper, gold, etc.) on physically exposed surfaces of the first front metal seed layer 111L and the first backside metal seed layer 211L. In-process metal lines (121', 221') may be formed in the openings in the first patterned electroplating mask layers (131, 232). As used herein, an "in-process" element refers to an element that is subsequently modified. The in-process metal lines (121', 221') comprise first in-process front metal lines 121' that are formed on the physically exposed surface segments of the first front metal seed layer 111L in the openings in the first front patterned electroplating mask layer 131. Further, the in-process metal lines (121', 221') comprise first in-process backside metal lines 221' that are formed on the physically exposed surface segments of the first backside metal seed layer 211L in the openings in the first backside patterned electroplating mask layer 231. Generally, the first electroplating step electroplates metal lines in openings in the first patterned electroplating mask layers (131, 231) directly on the first metal seed layers (111L, 211L). The thickness of each electroplated in-process metal lines (121', 221') may be in a range from 3 microns to 60 microns, such as from 6 microns to 30 microns, although lesser and greater thicknesses may also be used. In one embodiment, one, a plurality, or each, of the electroplated in-process metal lines (121', 221') may have a respective set of at least one uniform-width portion and at least one pad portion having a greater width than the at least one uniform-width portion. In such embodiments, metal via structures may be formed entirely within the area of the at least one pad portion. While pad portions having circular shapes are illustrated in FIG. 5B, embodiments are expressly contemplated herein in which the pad portions have a horizontal cross-sectional shape that is not circular.

Figure 6:
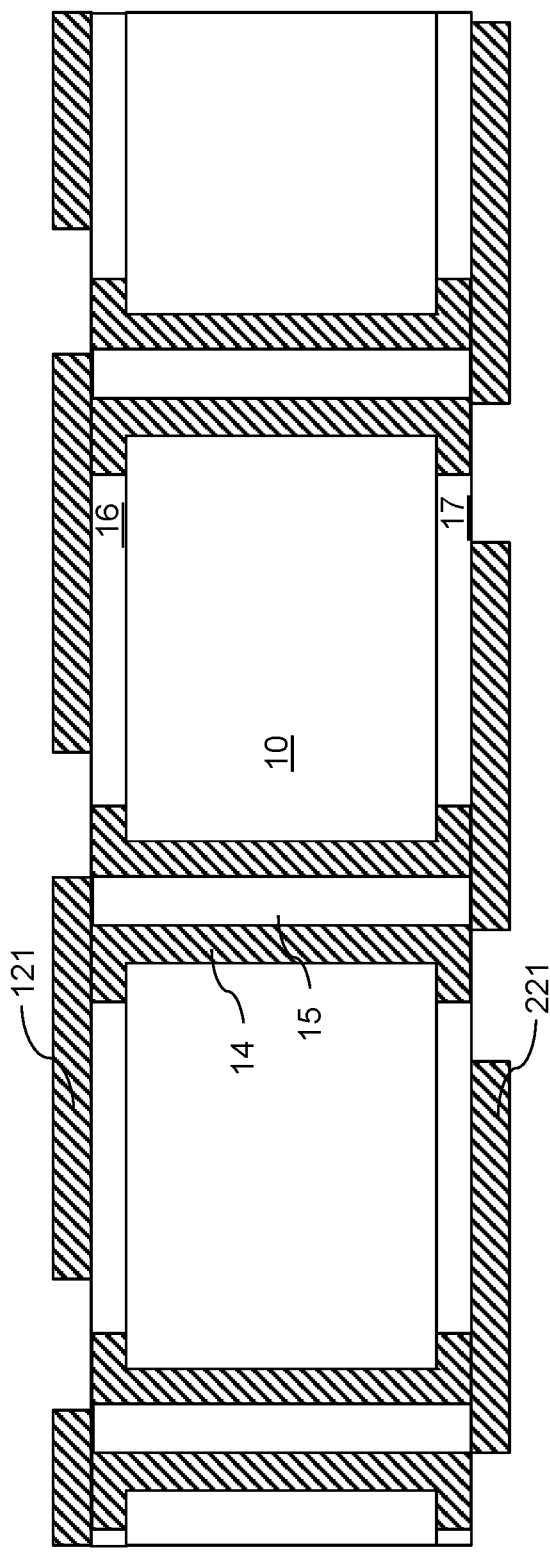
FIG. 6 is a vertical cross-sectional view of a region of the exemplary structure after removing unmasked portions of the first front metal seed layer (e.g., first front copper seed layer) and the first backside metal seed layer (e.g., first backside copper seed layer) according to an embodiment of the present disclosure.

Referring to FIG. 6, the first patterned electroplating mask layers (131, 231) may be removed, for example, by ashing. In one embodiment, unmasked portions (i.e., portions that are not covered by the electroplated in-process metal lines (121', 221') of the first front metal seed layer 111L and the first backside metal seed layer 211L may be removed by performing an etch process. The etch process may be an isotropic etch process or an anisotropic etch process. Generally, the unmasked portions of each metal seed layer (111L, 211L) comprise all portions of the metal seed layer (111L, 211L) that do not have an areal overlap with the metal lines (121, 221) that are in direct contact with the metal seed layer (111L, 211L).

Each remaining portion of the first front metal seed layer 111L and the first backside metal seed layer 211L may be combined with an adjoining one of the electroplated in-process metal lines (121', 221') to provide a respective first metal line (121, 221). The first metal lines (121, 221) comprise first front metal lines 121 and first backside metal lines 221. Each first front metal line 121 may comprise a portion of a first in-process front metal line 121' and a patterned portion of the first front metal seed layer 111L. Each first backside metal line 221 may comprise a portion of a first in-process backside metal line 221' and a patterned portion of the first backside metal seed layer 211L.

Figure 7:
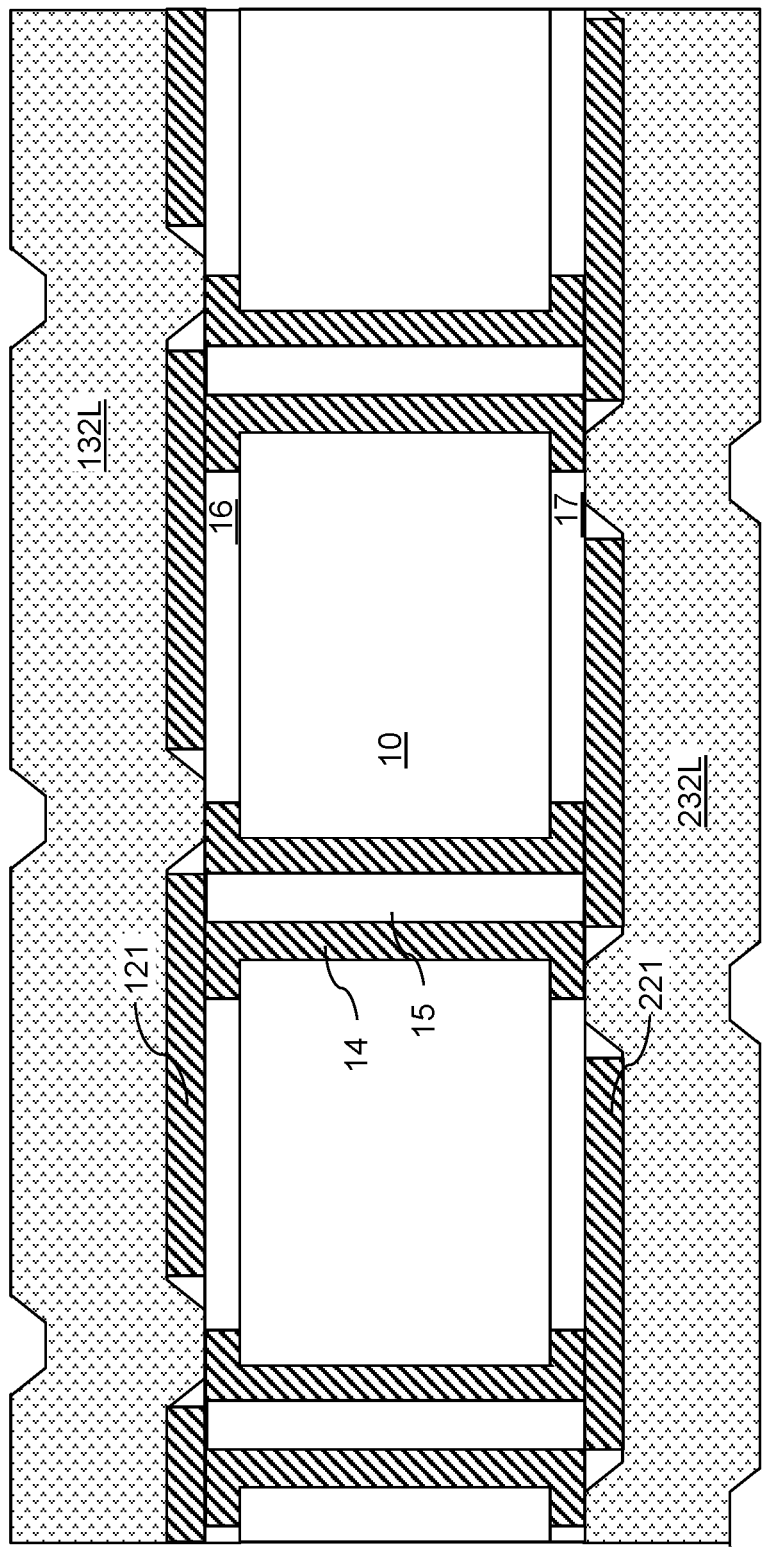
FIG. 7 is a vertical cross-sectional view of a region of the exemplary structure after attaching a second front electroplating mask layer and a second backside electroplating mask layer according to an embodiment of the present disclosure.

Referring to FIG. 7, a front photoresist material layer 132L may be attached to the first front metal lines 121 and the front cover dielectric layer 16, and a backside photoresist material layer 232L may be attached to the first backside metal lines 221 and the backside cover dielectric layer 17. In one embodiment, the front photoresist material layer 132L may be formed by attaching a photosensitive dry film to the first front metal lines 121 and the front cover dielectric layer 16, and the backside photoresist material layer 232L may be formed by attaching a photosensitive dry film to the first backside metal lines 221 and the backside cover dielectric layer 17.

Figure 8A:
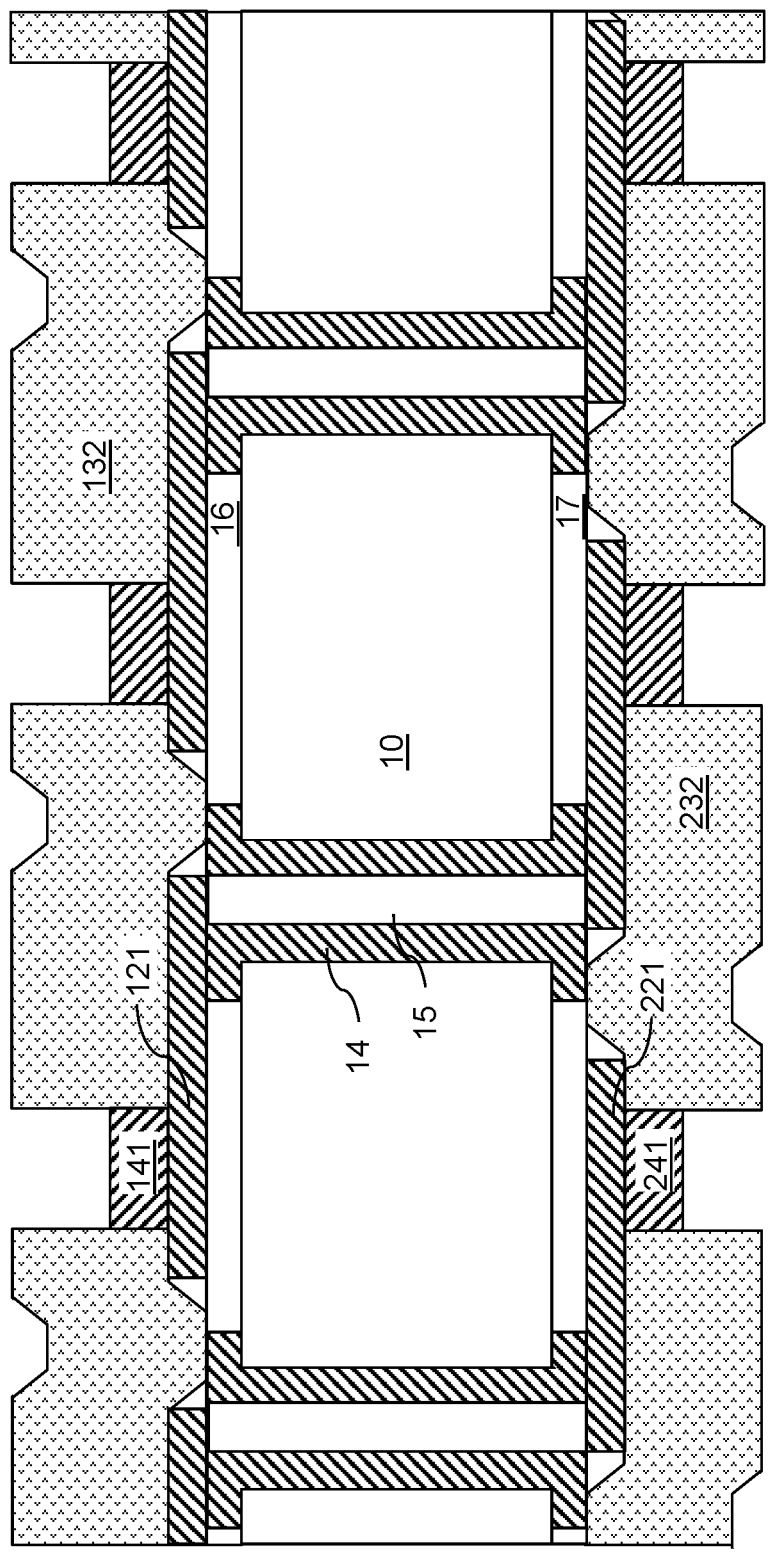
FIG. 8A is a vertical cross-sectional view of a region of the exemplary structure after patterning the second front patterned electroplating mask layer and the second backside patterned electroplating mask layer and forming first front metal via structures and first backside metal via structures according to an embodiment of the present disclosure.
Figure 8B:
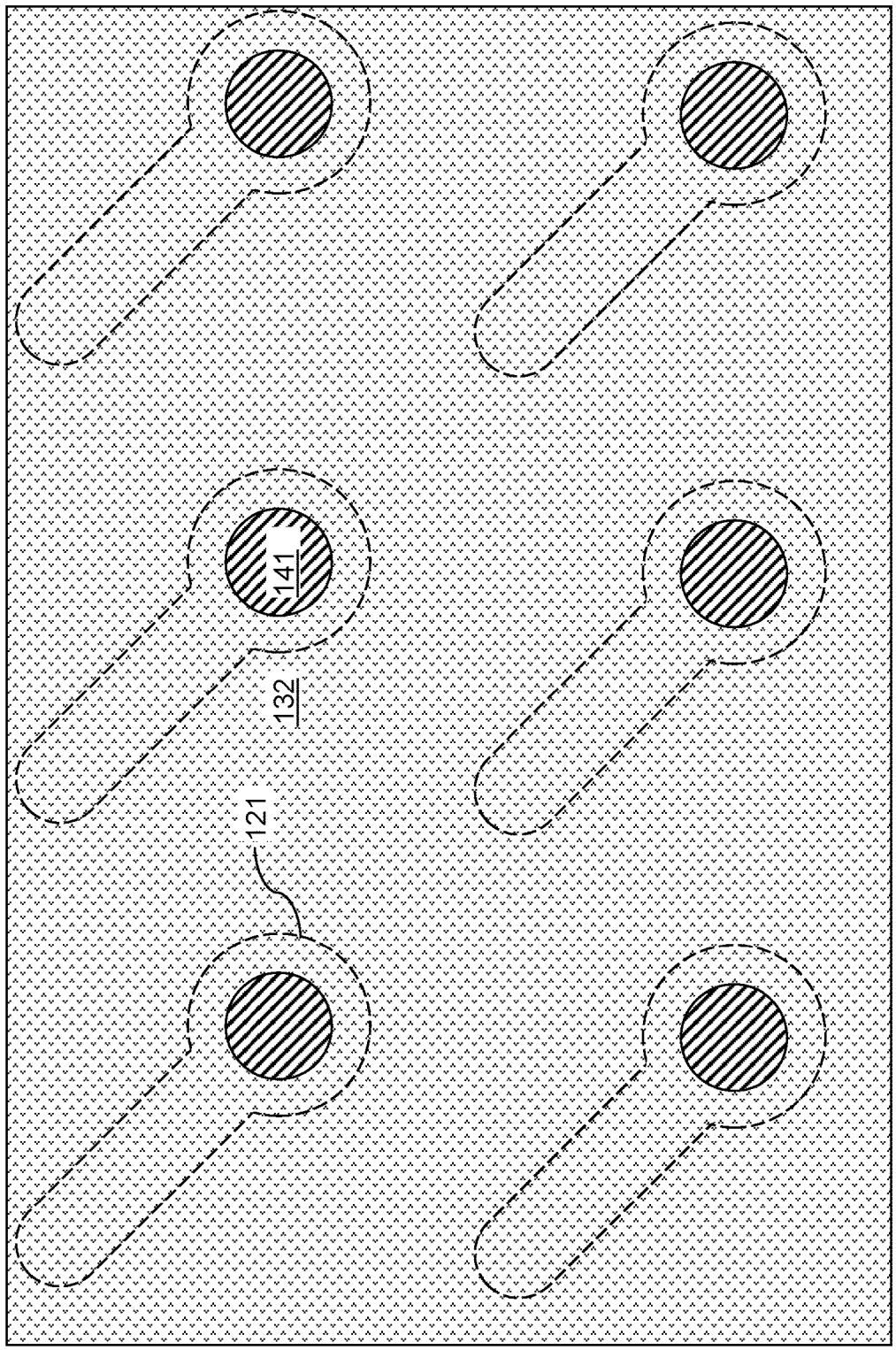
FIG. 8B is a top-down view of the region of the exemplary structure of FIG. 8A.

Referring to FIGS. 8A and 8B, a second lithographic patterning step may be performed to form patterned electroplating mask layers, which may include a second front patterned electroplating mask layer 132 and a second backside patterned electroplating mask layer 232. In one embodiment, the second front patterned electroplating mask layer 132 may be formed by lithographically exposing and developing the first photoresist material layer 132L to form openings in areas in which front metal via structures are to be subsequently formed. Likewise, the second backside patterned electroplating mask layer 232 may be formed by lithographically exposing and developing the second photoresist material layer 232L to form openings in areas in which backside metal via structures are to be subsequently formed.

In one embodiment, areas of openings in the second front patterned electroplating mask layer 132 may have an overlap with an area of a respective one of first front metal lines 121. In one embodiment, each opening in the second front patterned electroplating mask layer 132 may be laterally offset inward from a periphery of an underlying first front metal line 121. In this embodiment, a distal planar surface of a first front metal line 121 may be physically exposed within each opening in the second front patterned electroplating mask layer 132. As used herein, for each element that is formed on a substrate plate 10, a distal surface refers to a surface that is most distal from the substrate plate 10, and a proximal surface refers to a surface that is most proximal to the substrate plate 10. In one embodiment, areas of openings in the second backside patterned electroplating mask layer 232 may have an overlap with an area of a respective one of first backside metal lines 221. In one embodiment, each opening in the second backside patterned electroplating mask layer 232 may be laterally offset inward from a periphery of an overlying first backside metal line 221. In this embodiment, a distal planar surface of a first backside metal line 221 may be physically exposed within each opening in the second backside patterned electroplating mask layer 232.

A second electroplating step may be performed to electroplate metal on physically exposed surfaces of the first front metal lines 121 and the first backside metal lines 221. Metal via structures (141, 241) may be formed in the openings in the second patterned electroplating mask layers (132, 232). The metal via structures (141, 241) comprise first front metal via structures 141 that are formed on the physically exposed surface segments of the first front metal lines 121 in the openings in the second front patterned electroplating mask layer 132. Further, the metal via structures (141, 241) comprise first backside metal via structures 241 that are formed on the physically exposed surface segments of the first backside metal lines 221 in the openings in the second backside patterned electroplating mask layer 232. Generally, the first electroplating step electroplates metal via structures (141, 241) in openings in the second patterned electroplating mask layers (132, 232) directly on the first metal lines (121, 221). The thickness of the metal via structures (141, 241) may be in a range from 5 microns to 100 microns, such as from 10 microns to 50 microns, although lesser and greater thicknesses may also be used. In one embodiment, one, a plurality, or each, of the metal via structures (141, 241) may be formed within the area of a respective pad portion of an underlying, or overlying, first metal line (121, 221).

Generally, the second masking step that forms a second patterned electroplating mask layer over metal lines (such as the first copper lines (121, 221)). In one embodiment, each opening in the second patterned electroplating mask layer may be formed entirely within an area of a respective one of the metal lines (121, 221) in a plan view. For example, each opening in the second front patterned electroplating mask layer may be located entirely within an area of a respective one of the front metal lines 121 in a plan view, and each opening in the second backside patterned electroplating mask layer may be located entirely within an area of a respective one of the front metal lines 121 in the plan view. The second electroplating step that electroplates metal via structures (such as the first copper via structures (141, 241)) on the metal lines (121, 221). In one embodiment, the entirety of a proximal planar surface of each first metal via structure (141, 241) may contact a distal surface of respective first metal line (121, 221), and may be located entirely within a horizontal plane including the distal surface of the respective first metal line (121, 221).

Figure 9:
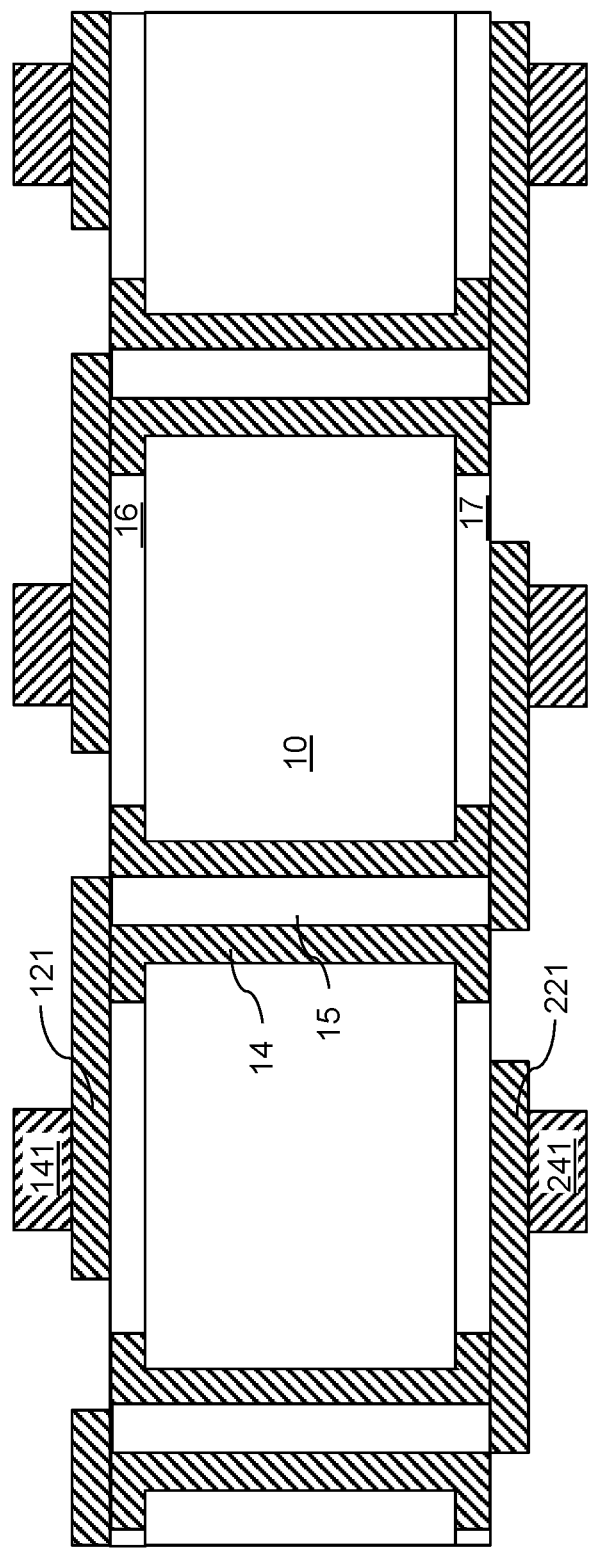
FIG. 9 is a vertical cross-sectional view of a region of the exemplary structure after removal of the second patterned electroplating mask layers according to an embodiment of the present disclosure.

Referring to FIG. 9, the second patterned electroplating mask layers (132, 232) may be removed, for example, by ashing. In one embodiment, each interface between an adjoined pair of a first metal line (121, 221) and a first metal via structure (141, 241) among the first metal lines (121, 221) and the first metal via structures (141, 241) is a metal-to-metal interface defined by a continuous horizontally-extending grain boundary having a root mean square surface roughness that is less than an average grain size of metal grains within the first metal lines (121, 221) and the first metal via structure. In one embodiment, within each adjoined pair of a first metal line (121, 221) and a first metal via structure (141, 241) among the first metal lines (121, 221) and the first metal via structures (141, 241), an area of the first metal via structure (141, 241) is located entirely within an area of the first metal line (121, 221) in a plan view, and a periphery of the first metal via structure (141, 241) is laterally offset inward from a periphery of the first metal line (121, 221) structure in the plan view.

Figure 10:
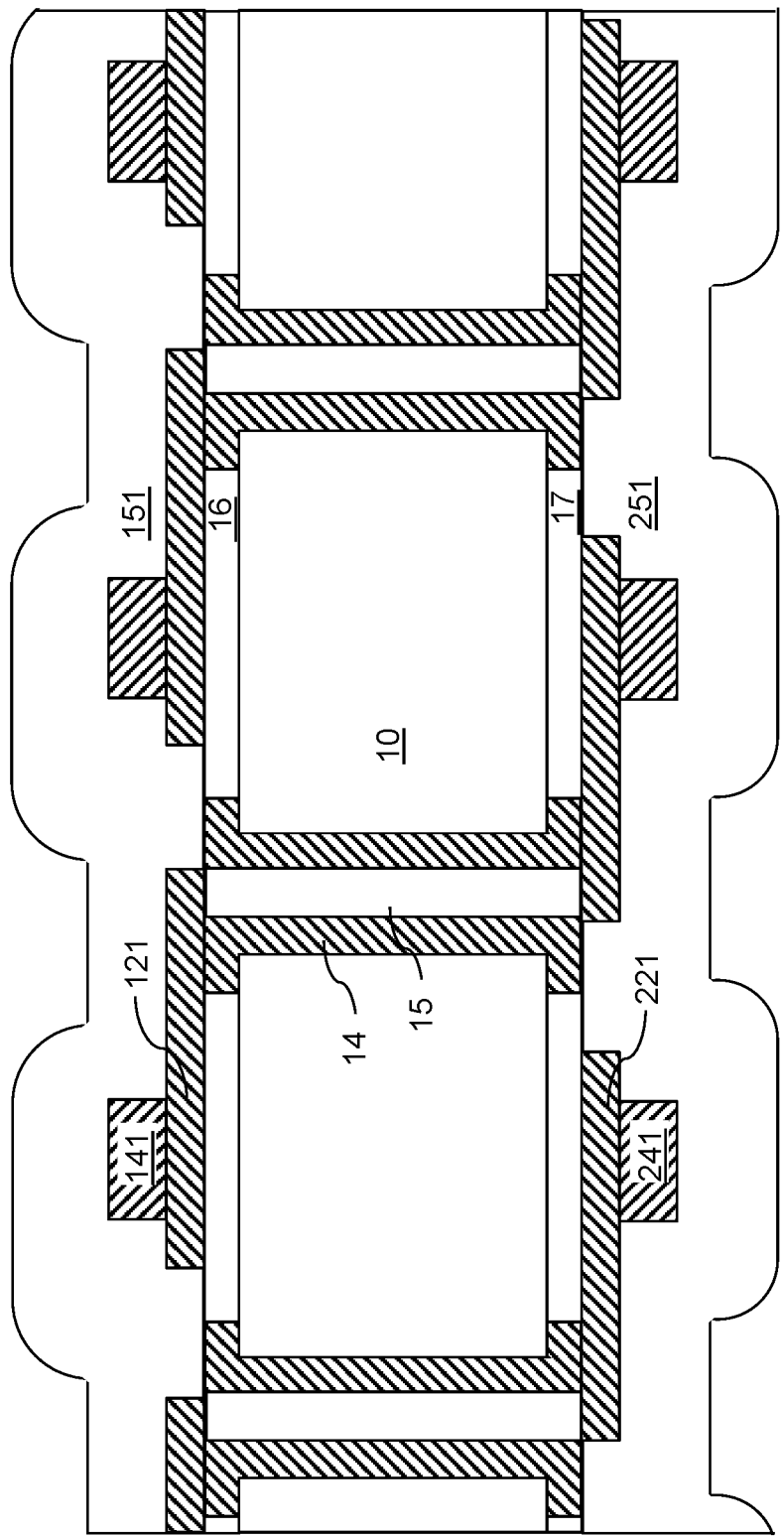
FIG. 10 is a vertical cross-sectional view of a region of the exemplary structure after formation of a first front dielectric material layer and a first backside dielectric material layer according to an embodiment of the present disclosure.

Referring to FIG. 10, a dielectric material deposition step may be performed to form a dielectric material layer on each side of the substrate plate 10, for example, by performing a lamination process. For example, a first front dielectric material layer 151 may be formed over the first front metal lines 121 and the first front metal via structures 141, and a first backside dielectric material layer 251 may be formed over the first backside metal lines 221 and the first backside metal via structures 241. Generally, each first dielectric material layer (151, 251) may be deposited over the first metal lines (121, 221) and the first metal via structures (141, 241). The first dielectric material layers (151, 251) may comprise a dielectric material such as epoxy, resin, polyimide (PI), benzocyclobutene (BCB), polybenzobisoxazole (PBO), or polyethylene terephthalate (PET). The distal surfaces of the first dielectric material layers (151, 251) may be formed with a surface topography that at least partially replicates the topography of the underlying first metal lines (121, 221) and the underlying first metal via structures (141, 241). Generally, the thicknesses of the first dielectric material layers (151, 251) may be selected such that the most proximal point within the physically exposed surfaces of the first dielectric material layers (151, 251) is located within the horizontal plane including distal planar surfaces of underlying (or overlying) first metal via structures (141, 241), or is more distal from the substrate plate 10 than the horizontal plane including distal planar surfaces of underlying (or overlying) first metal via structures (141, 241).

Figure 11:
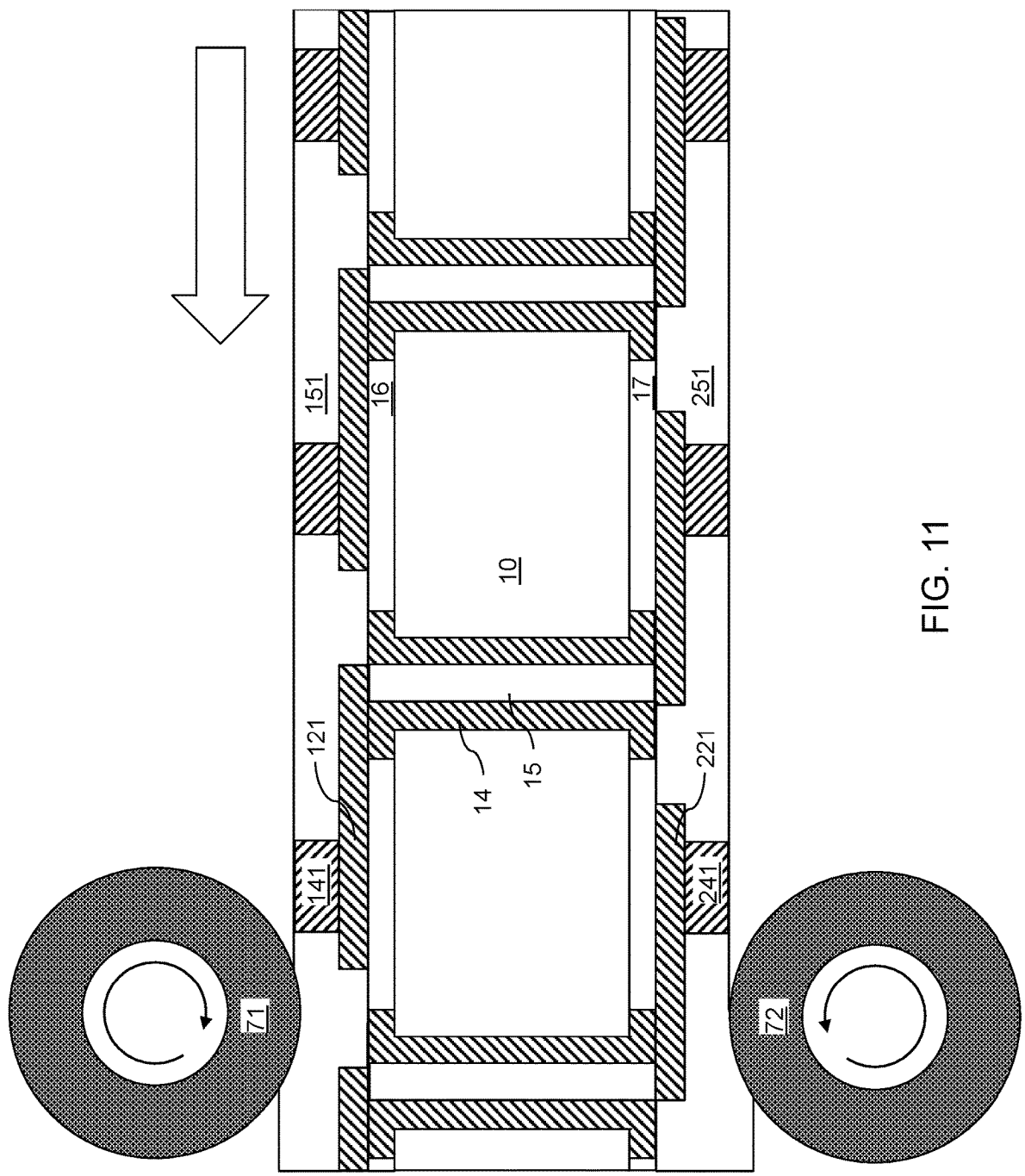
FIG. 11 is a vertical cross-sectional view of a region of the exemplary structure during removal of surface portions of the first front dielectric material layer and the first backside dielectric material layer according to an embodiment of the present disclosure.

Referring to FIG. 11, the exemplary structure is illustrated during a planarization step that removes surface portions of the first front dielectric material layer 151 and the first backside dielectric material layer 251. The planarization step may use any material removal process that may remove portions of the first dielectric material layers (151, 251) that are more distal from the substrate plate 10 than distal horizontal surfaces of the metal via structures (141, 241). Specifically, the planarization step performs a material removal process that removes portions of the first front dielectric material layer 151 that are more distal from the substrate plate 10 than the horizontal plane including the distal planar surfaces of the first front metal via structures 141, and removes portions of the first backside dielectric material layer 251 and are more distal from the substrate 10 than the horizontal plane including the distal planar surfaces of the first backside metal via structures 241.

Generally, the planarization process may us a grinding process, a polishing process, a milling process, or any other mechanical material removal process that removes material portions of the first dielectric material layers (151, 251) that are more distal from the substrate plate 10 than distal horizontal surfaces of the metal via structures (141, 241). In the illustrative example, the planarization process may use a grinding process using a front grinding wheel 71 that grinds off portions of the first front dielectric material layer 151 that are more distal from the substrate plate 10 than the horizontal plane including the distal planar surfaces of the first front metal via structures 141, and a backside grinding wheel 72 that grinds off portions of the first backside dielectric material layer 251 and are more distal from the substrate 10 than the horizontal plane including the distal planar surfaces of the first backside metal via structures 241.

Figure 12A:
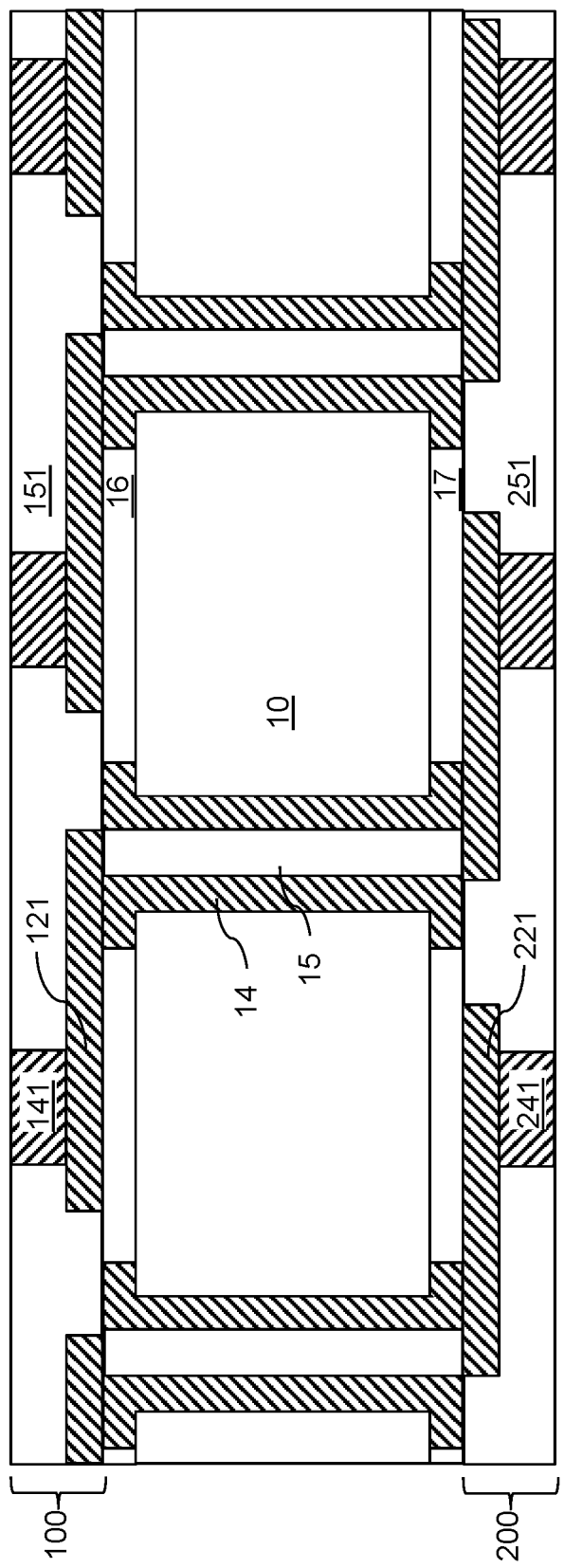
FIG. 12A is a vertical cross-sectional view of a region of the exemplary structure after removal the surface portions of the first front dielectric material layer and the first backside dielectric material layer according to an embodiment of the present disclosure.
Figure 12B:
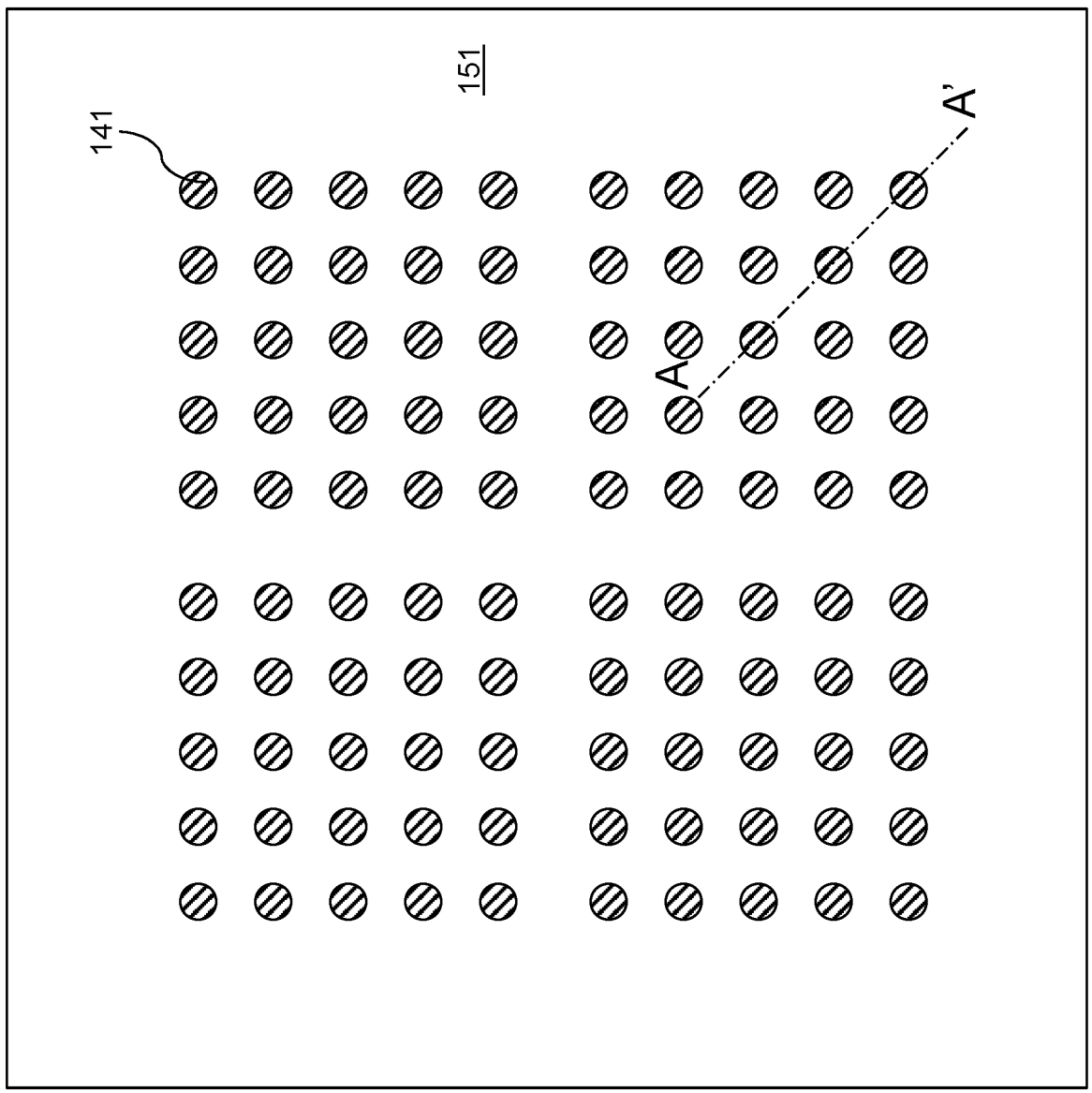
FIG. 12B is a top-down view of the exemplary structure at the processing steps of FIG. 12A. The vertical plane A-A' is the cut plane of the vertical cross-sectional view of FIG. 12A.
Figure 12C:
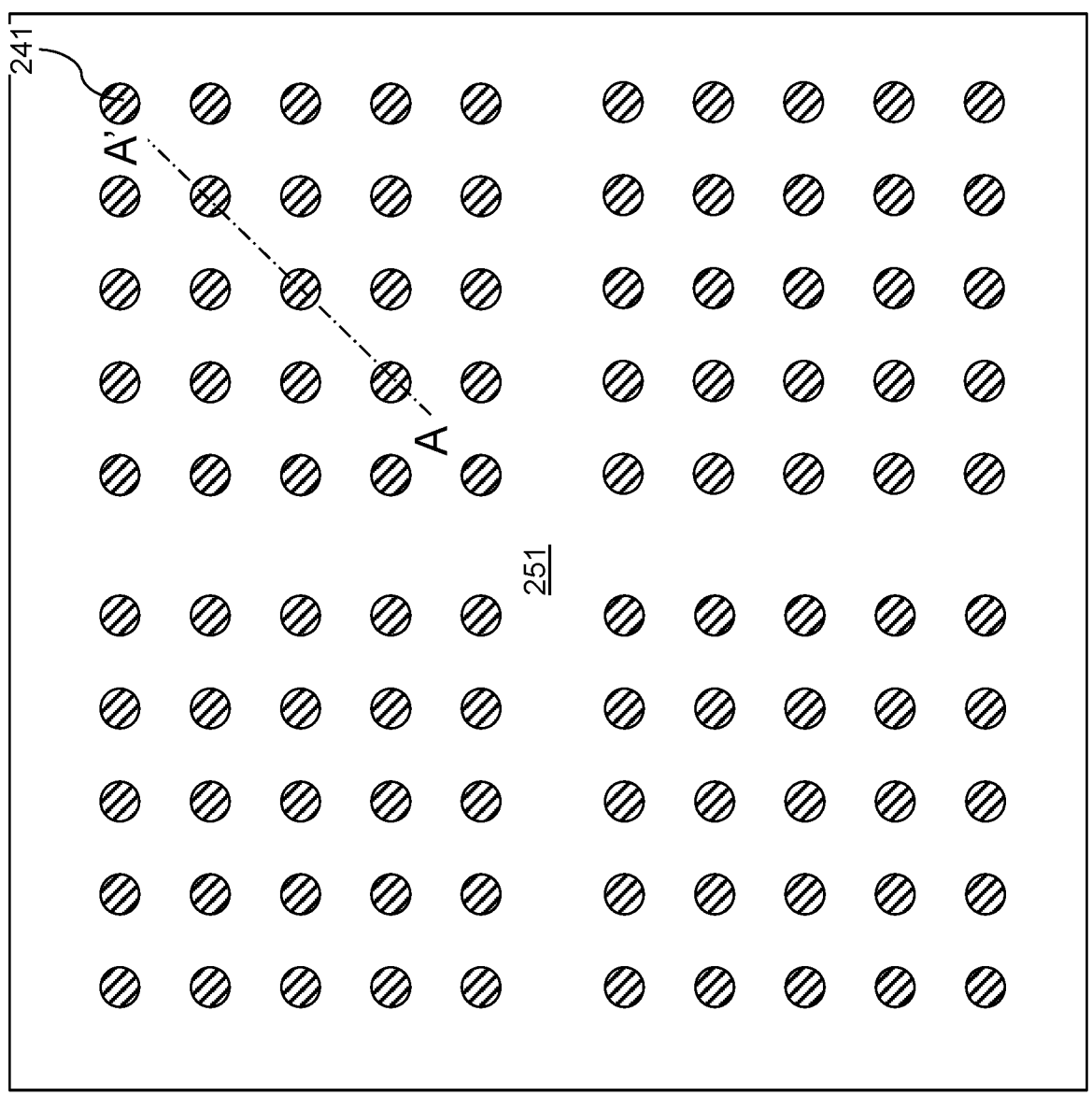
FIG. 12C is a bottom-up view of the exemplary structure at the processing steps of FIG. 12A. The vertical plane A-A' is the cut plane of the vertical cross-sectional view of FIG. 12A.

Referring to FIGS. 12A-12C, the exemplary structure is illustrated after completion of the planarization process. The remaining portion of the first front dielectric material layer 151 may have a distal planar surface that is coplanar with the planar distal surfaces of the first front metal via structures 141. The remaining portions of the first backside dielectric material layer 241 may have a distal planar surface that is coplanar with the planar distal surfaces of the first backside metal via structures 241. A combination of the first front metal lines 121, the first front metal via structures 141, and the first front dielectric material layer 151 constitutes a front interconnect-level structure 100. The front interconnect-level structure may be formed between a horizontal plane including an interface with the front cover dielectric layer 16 and a horizontal plane including distal surfaces of the first front metal via structures 141 and the first front dielectric material layer 151. A combination of the first backside metal lines 221, the first backside metal via structures 241, and the first backside dielectric material layer 251 constitutes a backside interconnect-level structure 200. The backside interconnect-level structure may be formed between a horizontal plane including an interface with the backside cover dielectric layer 251 and a horizontal plane including distal surfaces of the first backside metal via structures 241 and the first backside dielectric material layer 251.

Figure 13:
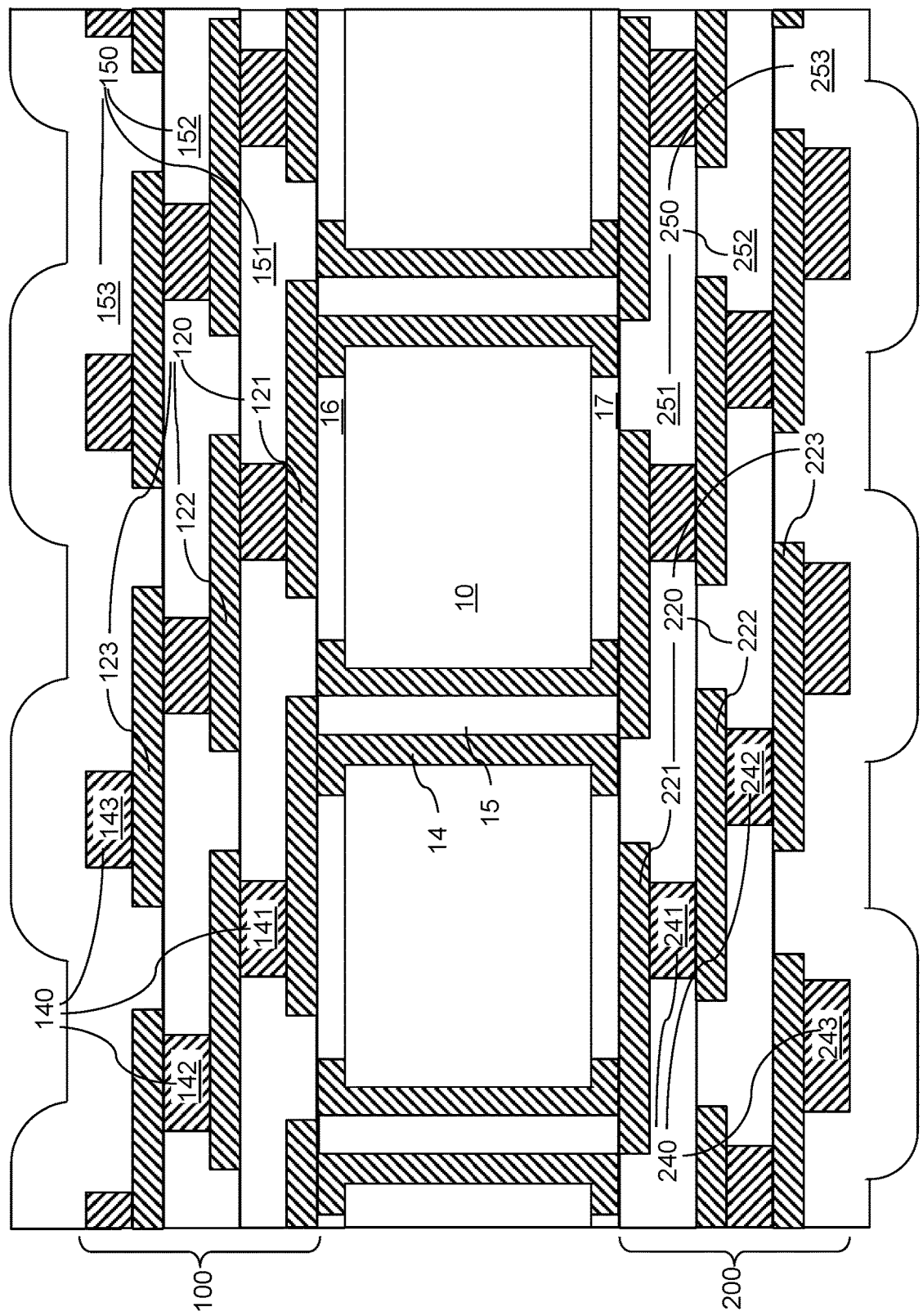
FIG. 13 is a vertical cross-sectional view of a region of the exemplary structure after formation of front interconnect-level structures and backside interconnect-level structures according to an embodiment of the present disclosure.

Referring to FIG. 13, the unit sequence of processing steps described with reference to FIGS. 3-12C may, or may not, be repeated with suitable changes in the lithographic patterns. Each repetition of the unit sequence of processing steps may form an additional front interconnect-level structure 100 and an additional backside interconnect-level structure 200. The exemplary structure illustrated in FIG. 13 represents an embodiment in which the unit sequence of processing steps is repeated twice with the omission of the planarization step in the last repetition of the unit sequence of processing steps.

In this embodiment, a first repletion of the unit sequence of processing steps after the processing steps of FIGS. 12A-12C may form a front interconnect-level structure including second front metal lines 122, second front metal via structures 142, and a second front dielectric material layer 152, and form a backside interconnect-level structure including second backside metal lines 222, second backside metal via structures 242, and a second backside dielectric material layer 252. A second repletion of the unit sequence of processing steps after first repletion of the unit sequence of processing steps may form a front interconnect-level structure including third front metal lines 123, third front metal via structures 143, and a third front dielectric material layer 153, and form a backside interconnect-level structure including third backside metal lines 223, third backside metal via structures 243, and a third backside dielectric material layer 252.

The first front metal lines 121, the second front metal lines 122, and the third front metal lines 123 are collectively referred to as front metal lines 120. The first front metal via structures 141, the second front metal via structures 142, and third front metal via structures 143 are collectively referred to as front metal via structures 140. The first front dielectric material layer 151, the second front dielectric material layer 152, and the third front dielectric material layer 153 are collectively referred to as front dielectric material layers 150. The first backside metal lines 221, the second backside metal lines 222, and the third backside metal lines 223 are collectively referred to as backside metal lines 220. The first backside metal via structures 241, the second backside metal via structures 242, and third backside metal via structures 243 are collectively referred to as backside metal via structures 240. The first backside dielectric material layer 251, the second backside dielectric material layer 252, and the third backside dielectric material layer 253 are collectively referred to as backside dielectric material layers 250.

Figure 14A:
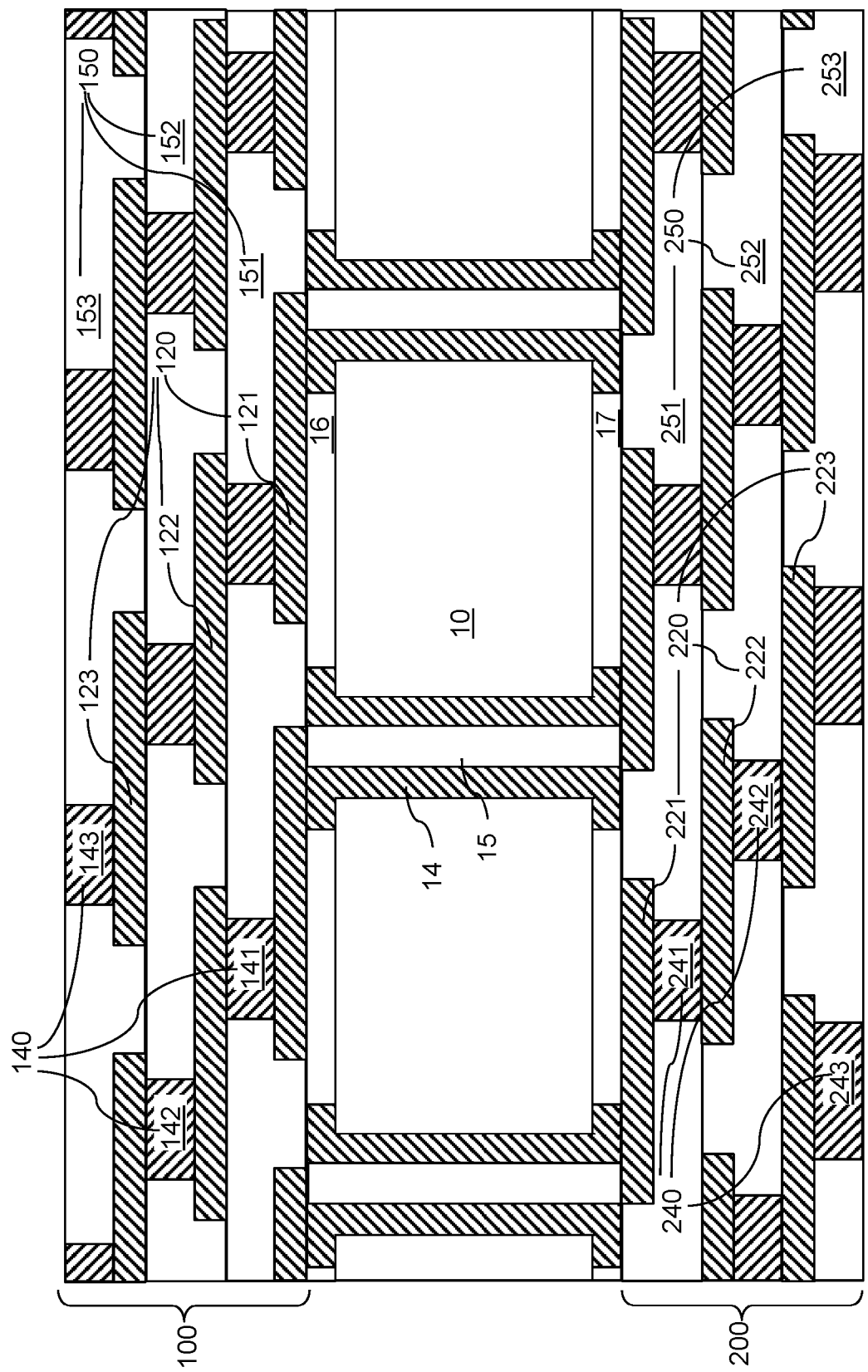
FIG. 14A is a vertical cross-sectional view of a region of the exemplary structure after removing the surface portions of the most distal front dielectric material layer and the most distal backside dielectric material layer according to an embodiment of the present disclosure.
Figure 14B:
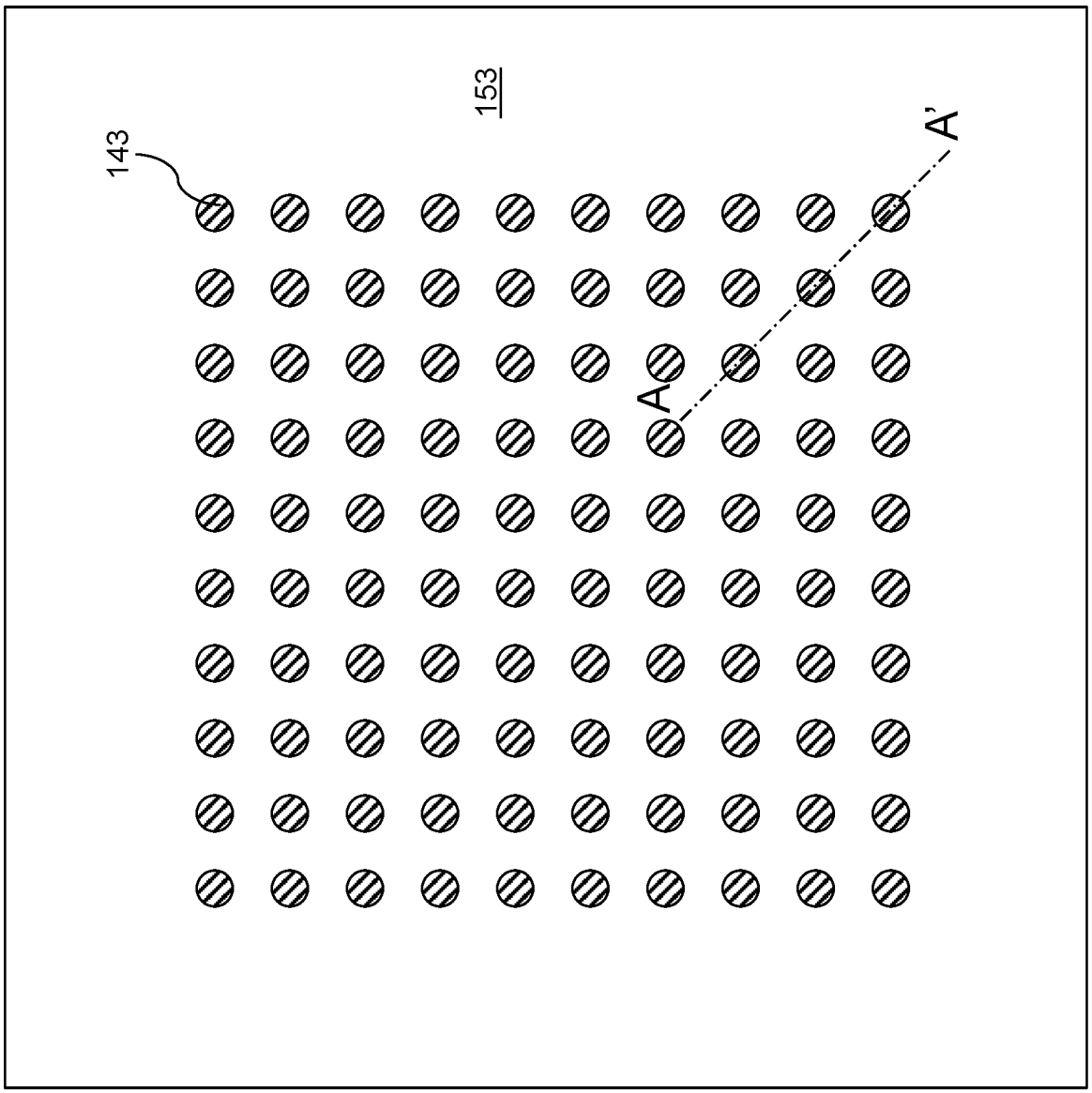
FIG. 14B is a top-down view of the exemplary structure at the processing steps of FIG. 14A. The vertical plane A-A' is the cut plane of the vertical cross-sectional view of FIG. 14A.
Figure 14C:
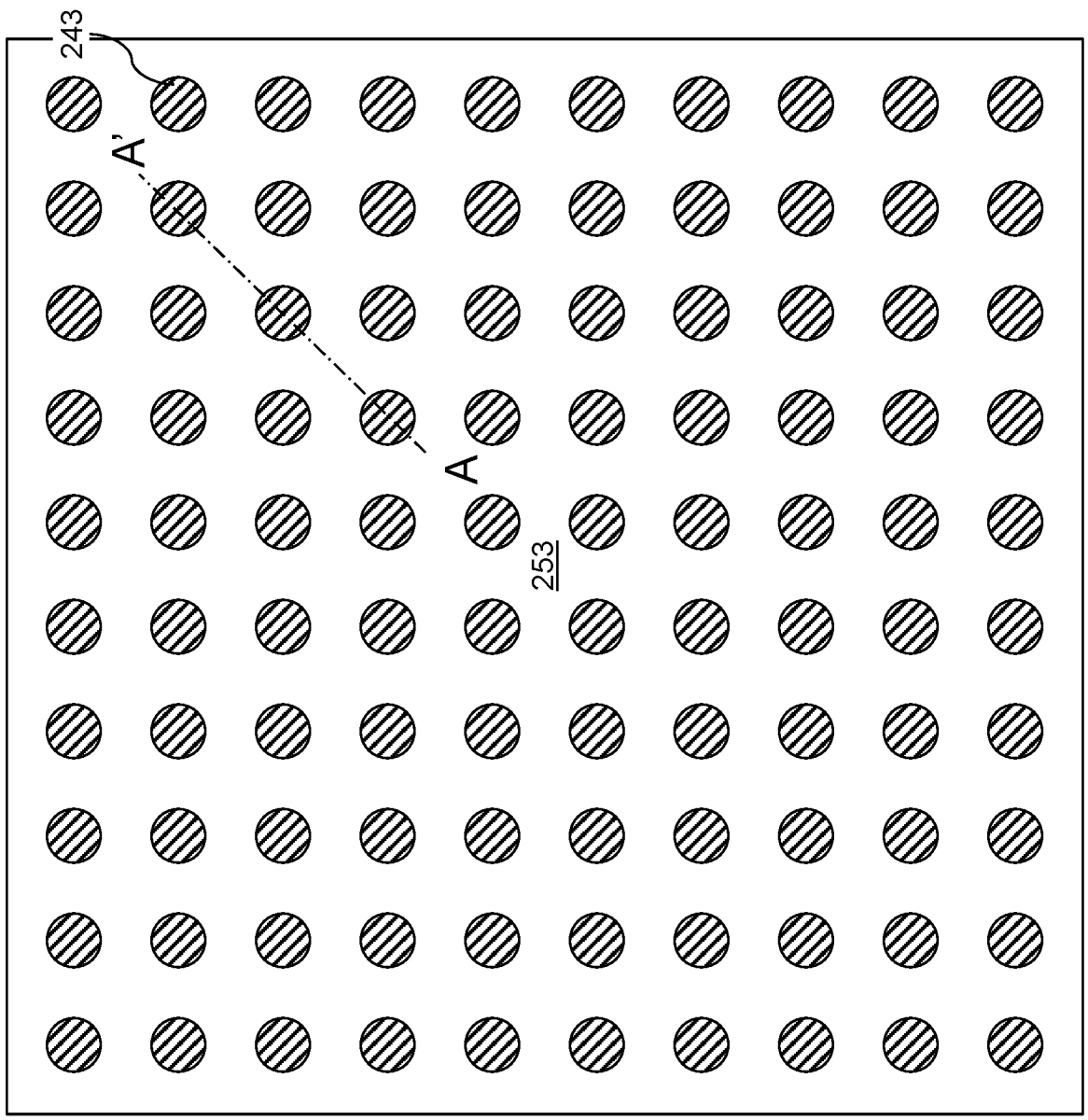
FIG. 14C is a bottom-up view of the exemplary structure at the processing steps of FIG. 14A. The vertical plane A-A' is the cut plane of the vertical cross-sectional view of FIG. 14A.

Referring to FIGS. 14A-14C, a planarization step may be performed to remove portions of the third dielectric material layers (153, 253) that are more distal from the substrate plate 10 than distal horizontal surfaces of the third metal via structures (143, 243). Specifically, the planarization step performs a material removal process that removes portions of the third front dielectric material layer 151 that are more distal from the substrate plate 10 than the horizontal plane including the distal planar surfaces of the third front metal via structures 143, and removes portions of the third backside dielectric material layer 251 and are more distal from the substrate 10 than the horizontal plane including the distal planar surfaces of the third backside metal via structures 241. The planarization process may use a grinding process, a polishing process, a milling process, or any other mechanical material removal process.

Generally, the unit sequence of processing steps described with reference to FIGS. 3-12C may be performed once, or may be performed repeatedly with suitable modifications in the lithographic patterns (and thus, with accompanying changes in the patterns of the metal lines and metal via structures). In embodiments in which the unit sequence of processing steps is repeated, the total number of repetitions of the unit sequence of processing steps may be in a range from 2 to 20, although greater numbers of repetitions may also be used. Further, while the present disclosure is described using an embodiment in which each interconnect-level structure (100, 200) is formed by performing the unit sequence of processing steps described with reference to FIGS. 3-12C, embodiments are expressly contemplated herein in which only a subset of the interconnect-level structures (100, 200) is formed using the unit sequence of processing steps described with reference to FIGS. 3-12C, and at least one interconnect-level structure may be formed using a sequence of processing steps that is different from the unit sequence of processing steps described with reference to FIGS. 3-12C.

Generally speaking, at least one interconnect-level structure (100, 200) among the interconnect-level structures (100, 200) may be formed by performing a unit sequence of processing steps described with reference to FIGS. 3-12C. One or more front interconnect-level structures 100 and one or more backside interconnect-level structures 200 may be formed on a substrate plate 10. At least one interconnect-level structure (100, 200) selected from the one or more front interconnect-level structures 100 and the one or more backside interconnect-level structures 200 comprises a respective set of elements that comprises: a dielectric material layer (150, 250) having a proximal horizontal dielectric surface located within a first horizontal plane and having a distal horizontal dielectric surface located within a second horizontal plane; metal lines (120, 220) having a respective proximal horizontal surface located entirely within the first horizontal plane and having a respective distal horizontal surface located between the first horizontal plane and the second horizontal plane; and metal via structures (140, 240) having a respective proximal horizontal surface in contact with a distal horizontal surface of a respective one of the metal lines (121, 221) and having a respective distal horizontal surface located entirely within the second horizontal plane. In one embodiment, the entirety of the dielectric material layer (151, 251) has a homogeneous composition throughout, and the dielectric material layer (151, 251) extends continuously as a single continuous material portion, and is free of any seam or any internal interface therein.

Generally, each metal seed deposition step deposits the metal seed layer on physically exposed surfaces of metal portions attached to the substrate plate 10. For each metal seed deposition step that is performed after the processing steps of FIGS. 12A-12C, the physically exposed surfaces of the metal portions attached to the substrate plate 10 comprise physically exposed surfaces of underlying metal via structures (140, 240) that are formed in a previously performed unit sequence of processing steps. In embodiments in which an additional front interconnect-level structure 100 is formed on the front side of the substrate plate 10 and an additional backside interconnect-level structure 200 is formed on the backside of the substrate plate 10 prior to formation of a front interconnect-level structure 100 and a backside interconnect-level structure 200 by performing a unit sequence of processing steps, the additional front interconnect-level structure 100 comprises additional front metal via structures 140, the additional backside interconnect-level structure 200 comprises additional backside metal via structures 240, the front metal seed layer is deposited on the additional front metal via structures 140, and the backside metal seed layer is deposited on the additional backside metal via structures 240. In this embodiment, the front metal seed layer is deposited on a front patterned surface in which discrete front metal surfaces are exposed within a first horizontal plane including a front surface of a front dielectric material layer 150, and the backside metal seed layer is deposited on a backside patterned surface in which discrete backside metal surfaces are exposed within a second horizontal plane including a backside surface of a backside dielectric material layer.

Figure 15:
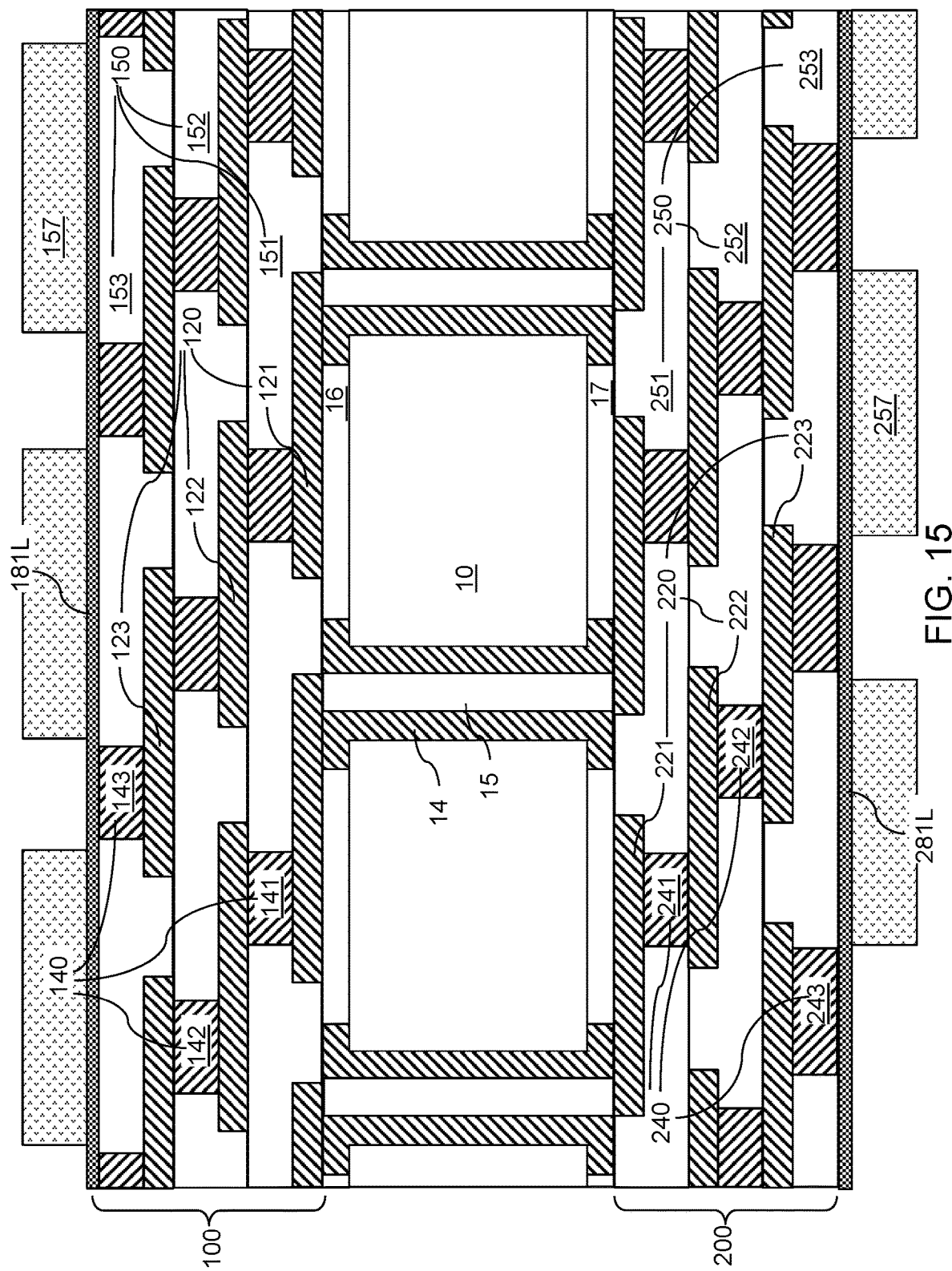
FIG. 15 is a vertical cross-sectional view of a region of the exemplary structure after formation of a front underbump metallization layer, a backside underbump metallization layer, a patterned front bonding pad mask layer, and a patterned backside bonding pad mask layer according to an embodiment of the present disclosure.

Referring to FIG. 15, a front underbump metallization layer 181L and a backside underbump metallization layer 281L may be formed on the front interconnect-level structures 100 and on the backside interconnect-level structures 200, respectively. Each of the front underbump metallization layer 181L and the backside underbump metallization layer 281L may comprise an underbump metallization (UBM) layer stack. The order of material layers within the UBM layer stack is selected such that solder material portions may be subsequently bonded to portions of the bottom surface of the UBM layer stack. Layer stacks that may be used for the UBM layer stack include, but are not limited to, stacks of Cr/Cr-Cu/Cu/Au, Cr/Cr-Cu/Cu, TiW/Cr/Cu, Ti/Ni/Au, and Cr/Cu/Au. Other suitable materials are within the contemplated scope of disclosure. The thickness of the UBM layer stack may be in a range from 1 microns to 10 microns, such as from 2 microns to 5 microns, although lesser and greater thicknesses may also be used.

Subsequently, a patterned front bonding pad mask layer 157 and a patterned backside bonding pad mask layer 257 may be formed over the front underbump metallization layer 181L and the backside underbump metallization layer 281L, respectively. Each of the patterned front bonding pad mask layer 157 and the patterned backside bonding pad mask layer 257 may comprise a respective patterned photoresist layer having openings within areas of the most distal metal via structures (143, 243). In the illustrated example, the openings in the patterned front bonding pad mask layer 157 may be formed in areas having an overlap with areas of the third front metal via structures 143, and the openings in the patterned backside bonding pad mask layer 257 may be formed in areas having an overlap with areas of the third backside metal via structures 243.

Figure 16:
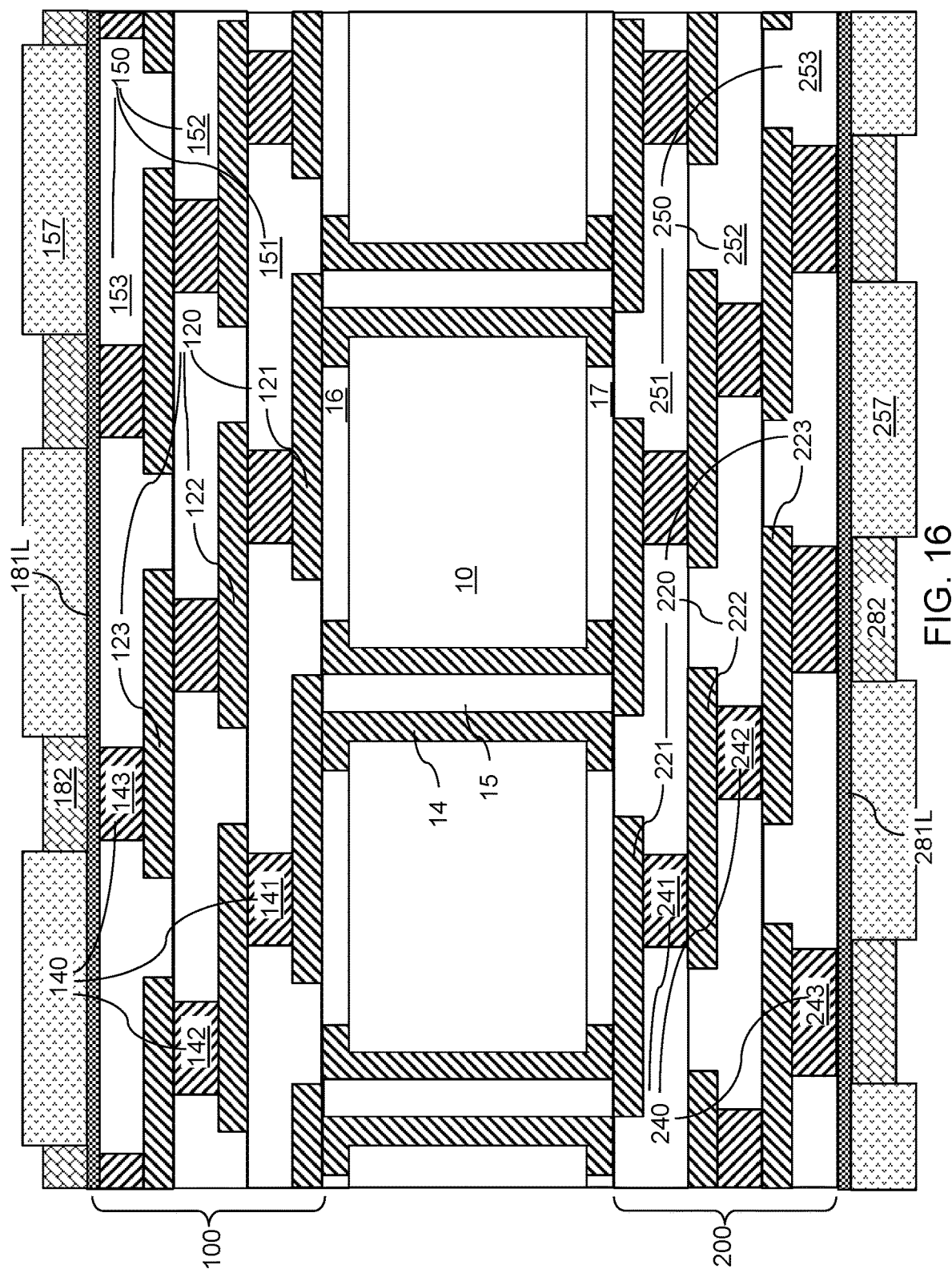
FIG. 16 is a vertical cross-sectional view of a region of the exemplary structure after formation of front metal pad portions (e.g., front copper pad portions) and backside copper pad portions (e.g., backside copper pad portions) according to an embodiment of the present disclosure.

Referring to FIG. 16, a metal electroplating process may be performed to form front metal pad portions 182 in the openings in the patterned front bonding pad mask layer 157, and to form backside metal pad portions 282 in the openings in the patterned backside bonding pad mask layer 257. The thickness of the front metal pad portions 182 and the backside metal pad portions 282 may be in a range from 5 microns to 100 microns, such as from 10 microns to 60 microns, although lesser and greater thicknesses may also be used.

Figure 17A:
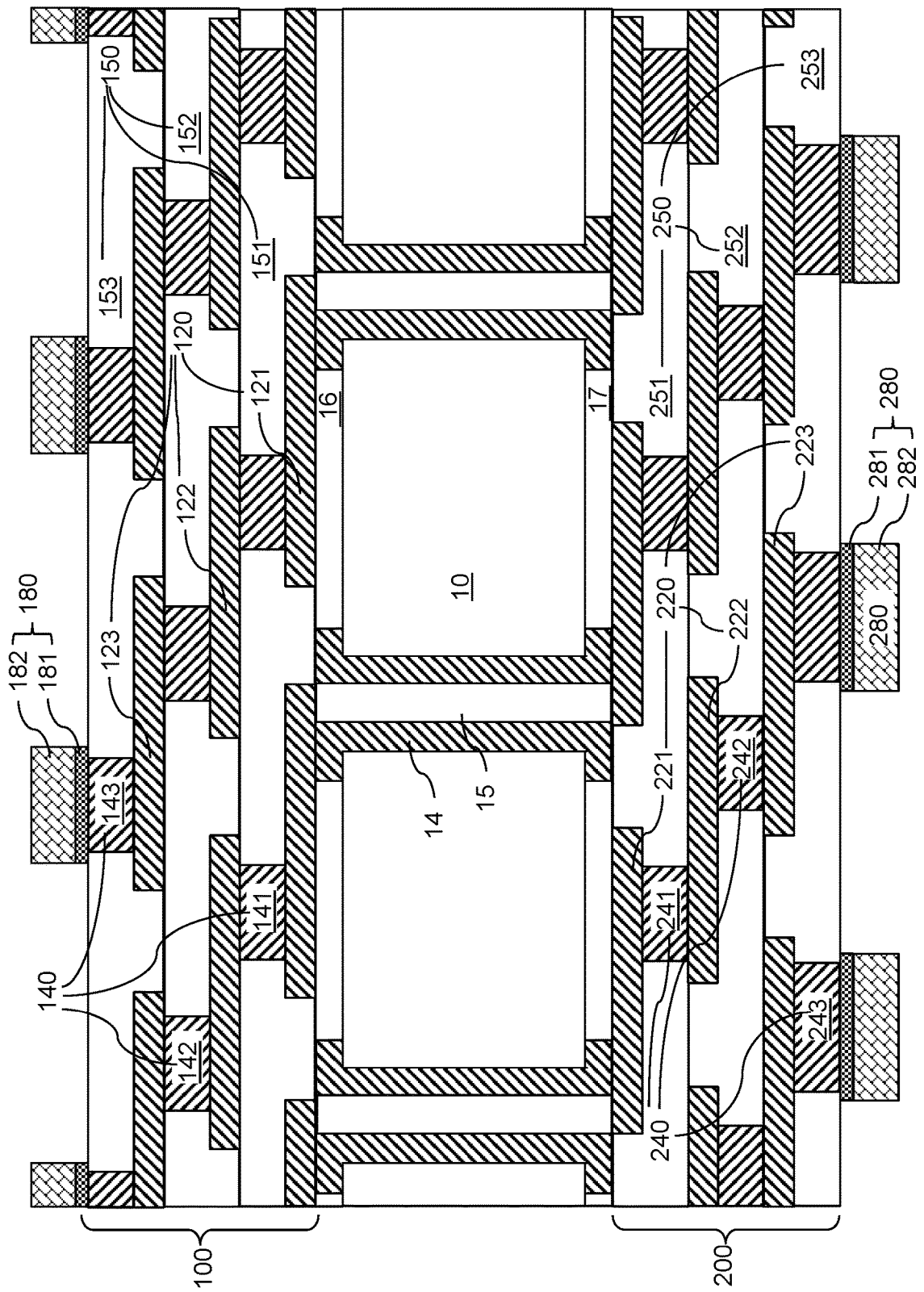
FIG. 17A is a vertical cross-sectional view of a region of the exemplary structure after formation of front bonding pads and backside bonding pads according to an embodiment of the present disclosure.
Figure 17B:
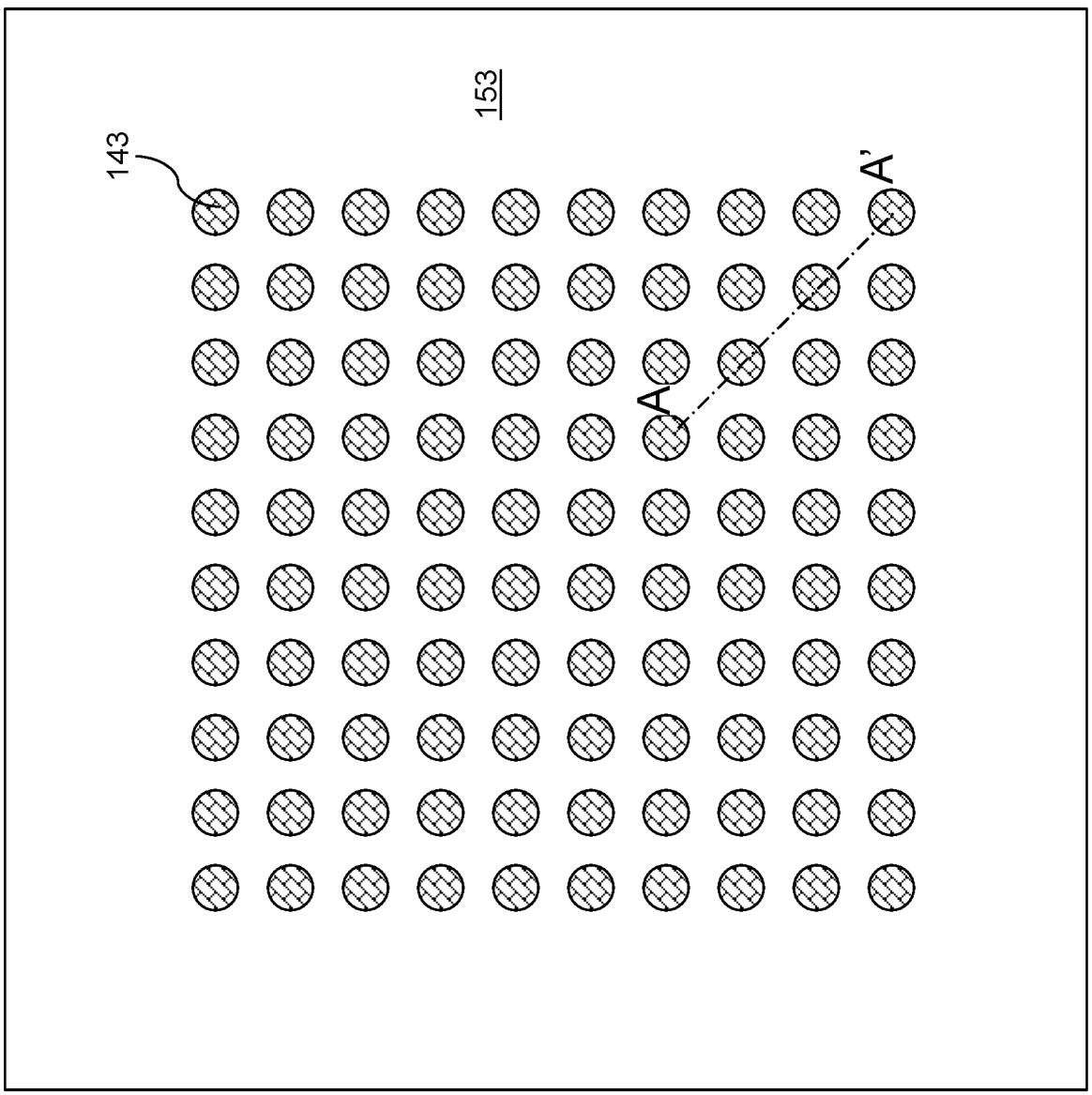
FIG. 17B is a top-down view of the exemplary structure at the processing steps of FIG. 17A. The vertical plane A-A' is the cut plane of the vertical cross-sectional view of FIG. 17A.
Figure 17C:
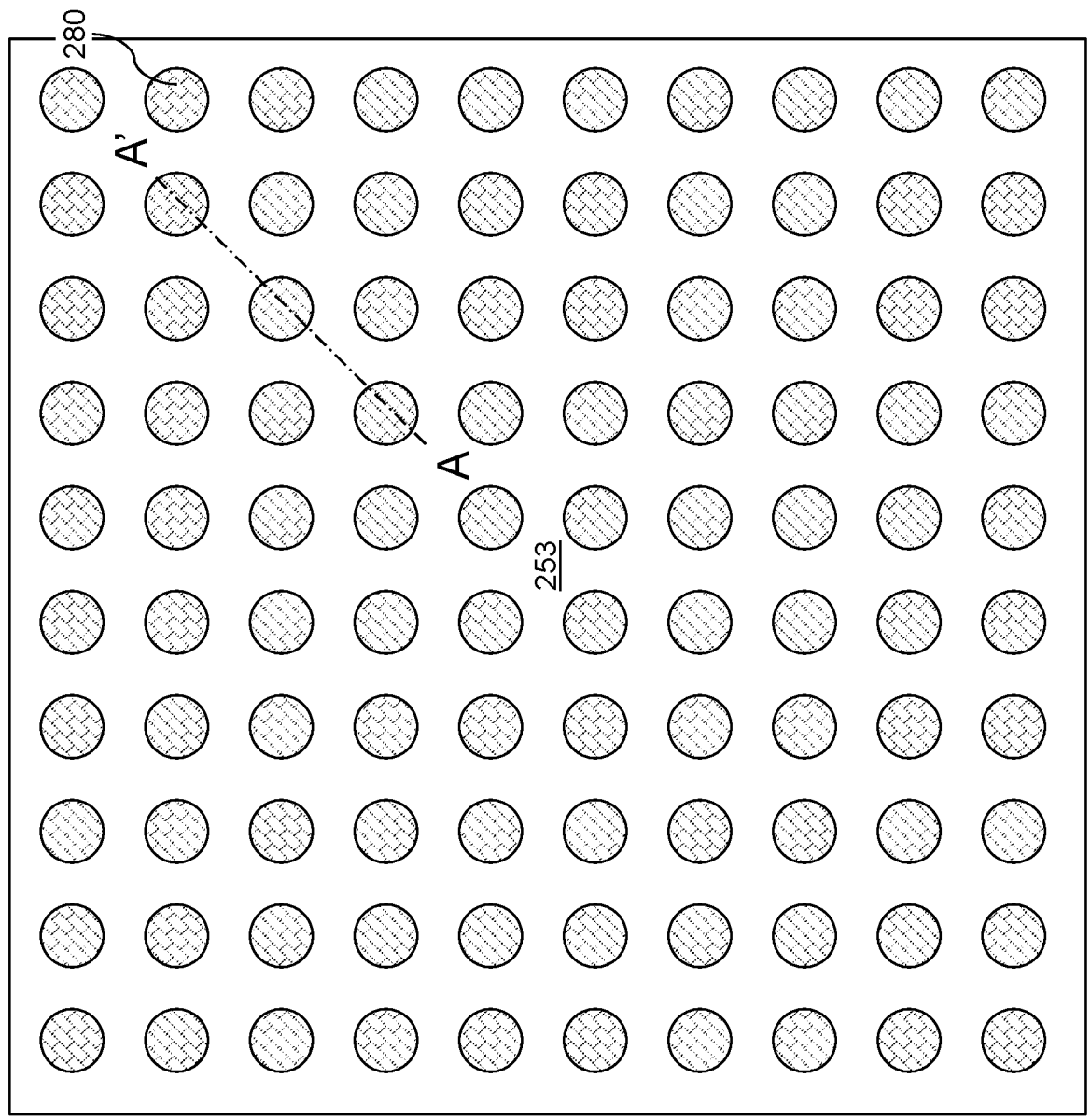
FIG. 17C is a bottom-up view of the exemplary structure at the processing steps of FIG. 17A. The vertical plane A-A' is the cut plane of the vertical cross-sectional view of FIG. 17A.

Referring to FIGS. 17A-17C, the patterned front bonding pad mask layer 157, and to form backside metal pad portions 242 in the openings in the patterned backside bonding pad mask layer 257 may be removed, for example, by ashing. Portions of the UBM layer stacks (i.e., the front underbump metallization layer 181L and the backside underbump metallization layer 281L) that are not covered by the front metal pad portions 182 or the backside metal pad portions 282 may be removed by performing an etch-back process. The etch-back process may comprise a wet etch process or a dry etch process. Each remaining portion of the front underbump metallization layer 181L constitutes a front UBM plate 181. Each remaining portion of the backside underbump metallization layer 281L constitutes a backside UBM plate 281. Each contiguous combination of a front UBM plate 181 and a front metal pad portion 182 constitutes a front bonding pad 180. Each contiguous combination of a backside UBM plate 281 and a backside metal pad portion 282 constitutes a backside bonding pad 280. A two-dimensional array of front bonding pads 180 may be formed on the front interconnect-level structures 100, and a two-dimensional array of backside bonding pads 280 may be formed on the backside interconnect-level structures 200. In one embodiment, front bonding pads 180 may be provided on an outermost one of the plurality of front interconnect-level structures 100, and backside bonding pads 280 may be provided on an outermost one of the plurality of backside interconnect-level structures 200.

While FIGS. 15, 16, 17A, and 17B illustrate an exemplary sequence of processing steps for forming the front bonding pads 180 and the backside bonding pads 280, embodiments of the present disclosure can be practiced in any alternative embodiment for forming front bonding pads and/or backside bonding pads. Generally, electroless plating processes and/or electrolytic plating processes may be used in any combination to form the bonding pads and/or backside bonding pads. A non-limiting illustrative example of alternative processing steps that may be used to form the bonding pads and/or backside bonding pads may include a sequence of processes including electroless nickel deposition/electroless palladium deposition/immersion gold deposition that uses an immersion gold flash, and is commonly referred to as the ENEPIG sequence.

Figure 18:
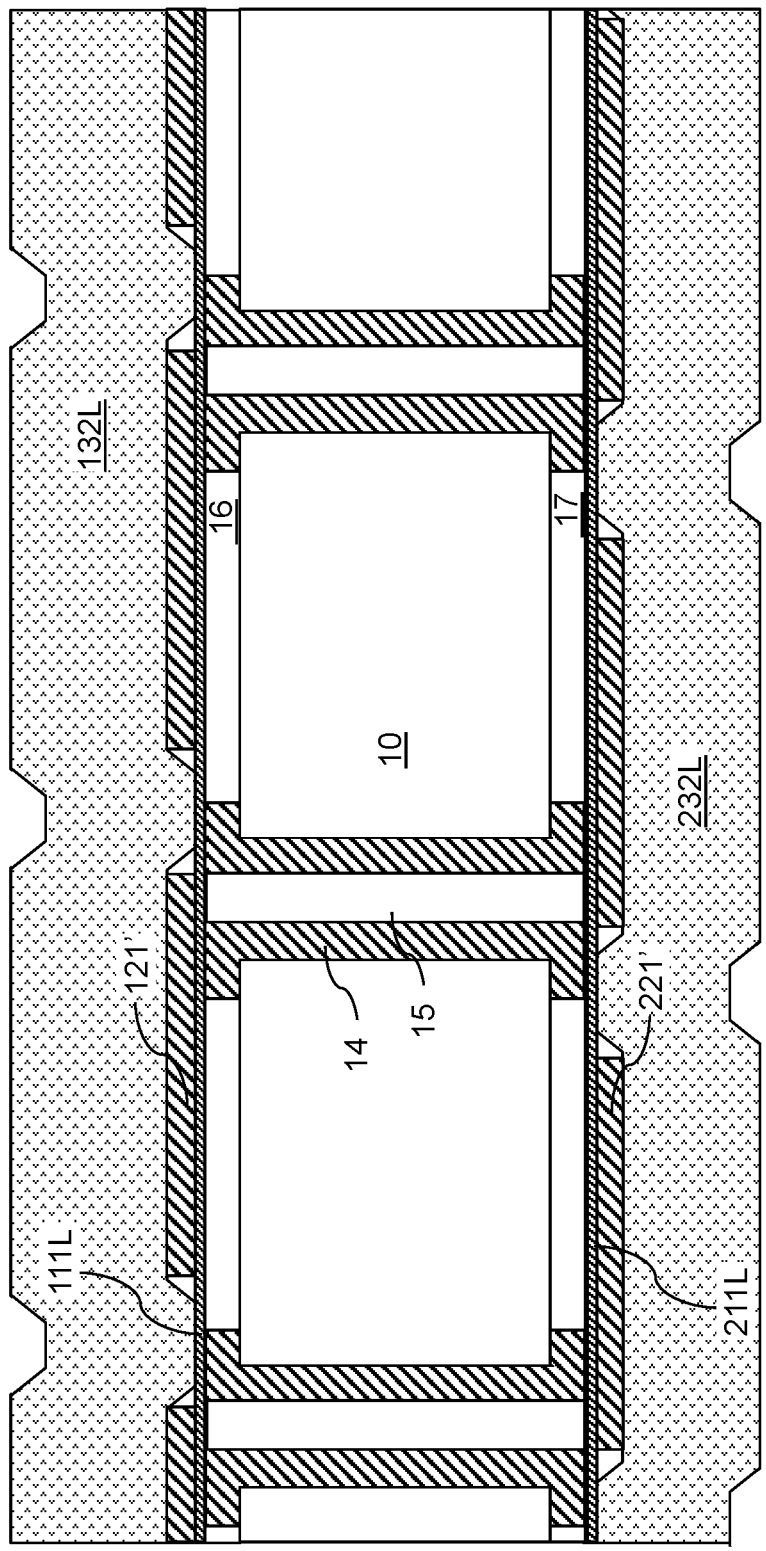
FIG. 18 is a vertical cross-sectional view of a region of an alternative configuration of the exemplary structure after attaching a second front electroplating mask layer and a second backside electroplating mask layer according to an embodiment of the present disclosure.

Referring to FIG. 18, an alternative configuration of the exemplary structure is illustrated, which may be formed during an alternative unit sequence of processing steps. Specifically, the alternative configuration of the exemplary structure illustrated in FIG. 18 may be derived from the exemplary structure illustrated in FIGS. 5A and 5B by omitting the processing steps of FIG. 6 and by performing the processing steps of FIG. 7. In this embodiment, the first front metal seed layer 111L and the first backside metal seed layer 211L may be present after formation of the front photoresist material layer 132L and the backside photoresist material layer 232L.

Figure 19:
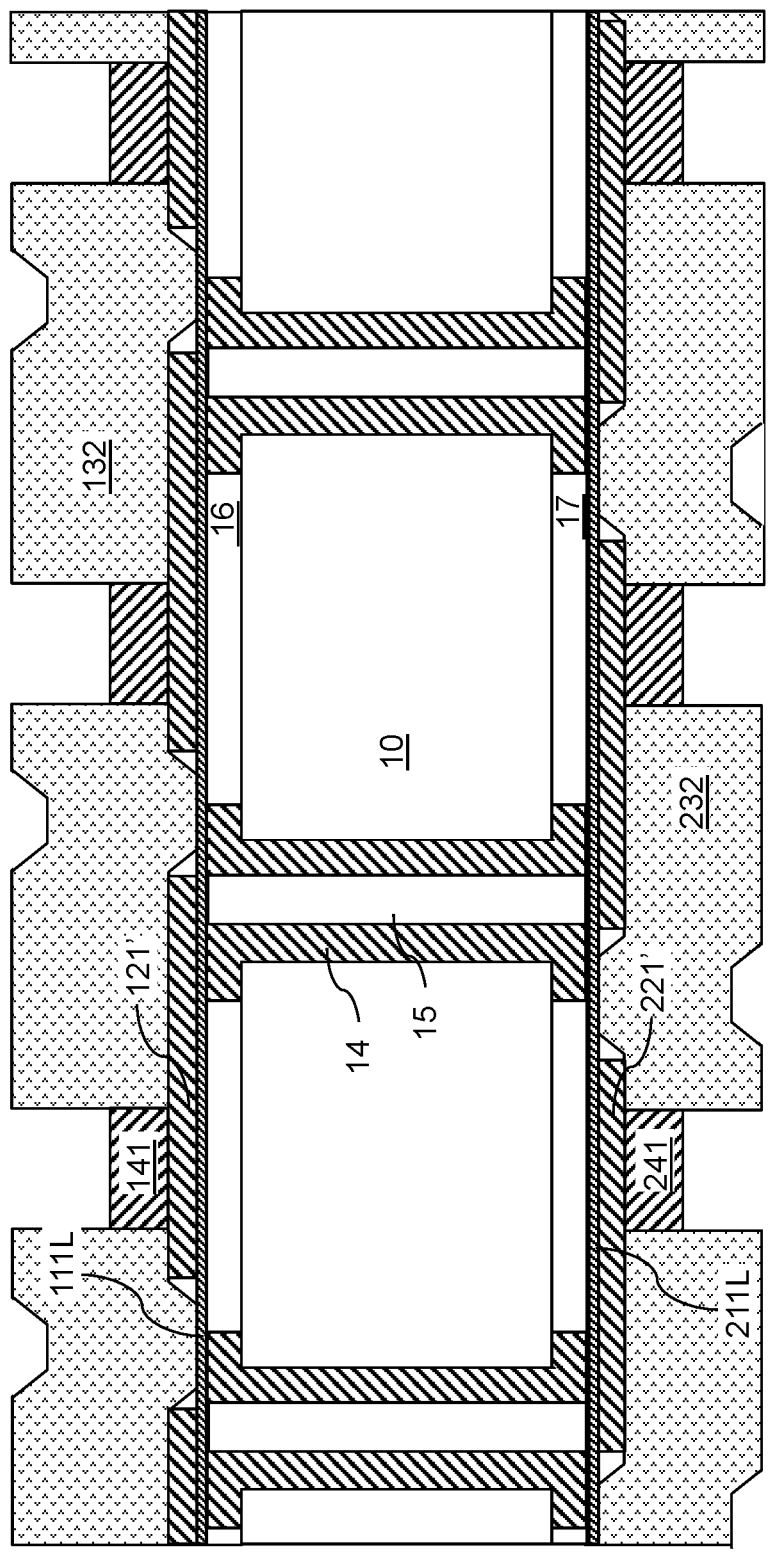
FIG. 19 is a vertical cross-sectional view of a region of the alternative configuration of the exemplary structure after patterning the second front patterned electroplating mask layer and the second backside patterned electroplating mask layer and forming first front metal via structures and first backside metal via structures according to an embodiment of the present disclosure.

Referring to FIG. 19, the processing steps of FIG. 8 may be performed to pattern the front photoresist material layer 132L and the backside photoresist material layer 232L into the second front patterned electroplating mask layer 132 and second backside patterned electroplating mask layer 232. The second electroplating process may be performed to form the first front metal via structures 141 (e.g., first front copper via structures) and the first backside metal via structures 242 (e.g., first backside copper via structures).

Subsequently, the second front patterned electroplating mask layer 132 and second backside patterned electroplating mask layer 232 may be removed, for example, by ashing. Unmasked portions of the first front metal seed layer 111L and the first backside metal seed layer 211L may be removed. Remaining portions of the first front metal seed layer 111L and the first backside metal seed layer 211L may be combined with the in-process metal lines (121', 221') to provide first metal lines (121, 221), which comprise the first front metal lines 121 and the first backside metal lines 221. The exemplary structure illustrated in FIG. 9 may be thus provided, and the processing steps of FIGS. 10-17C may be subsequently performed.

Figure 20:
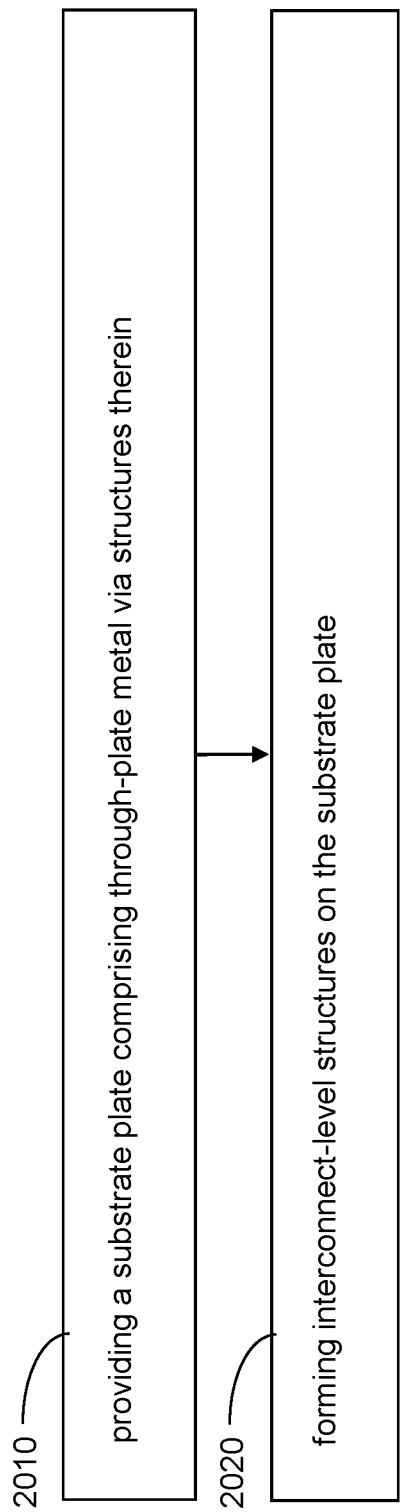
FIG. 20 is a first flowchart illustrating steps for forming a packaging substrate according to an embodiment of the present disclosure.

Referring to FIG. 20, a first flowchart illustrates steps for forming a packaging substrate according to an embodiment of the present disclosure.

Referring to step 2010 and FIGS. 1A-3, a substrate plate 10 comprising through-plate metal via structures (140, 240) therein is provided.

Referring to step 2020 and FIGS. 4-19, interconnect-level structures (100, 200) may be formed on the substrate plate 10. At least one interconnect-level structure (100, 200) among the interconnect-level structures (100, 200) may be formed using the unit sequence of processing steps (or an alternative thereof) described with reference to FIGS. 4-19.

Figure 21:
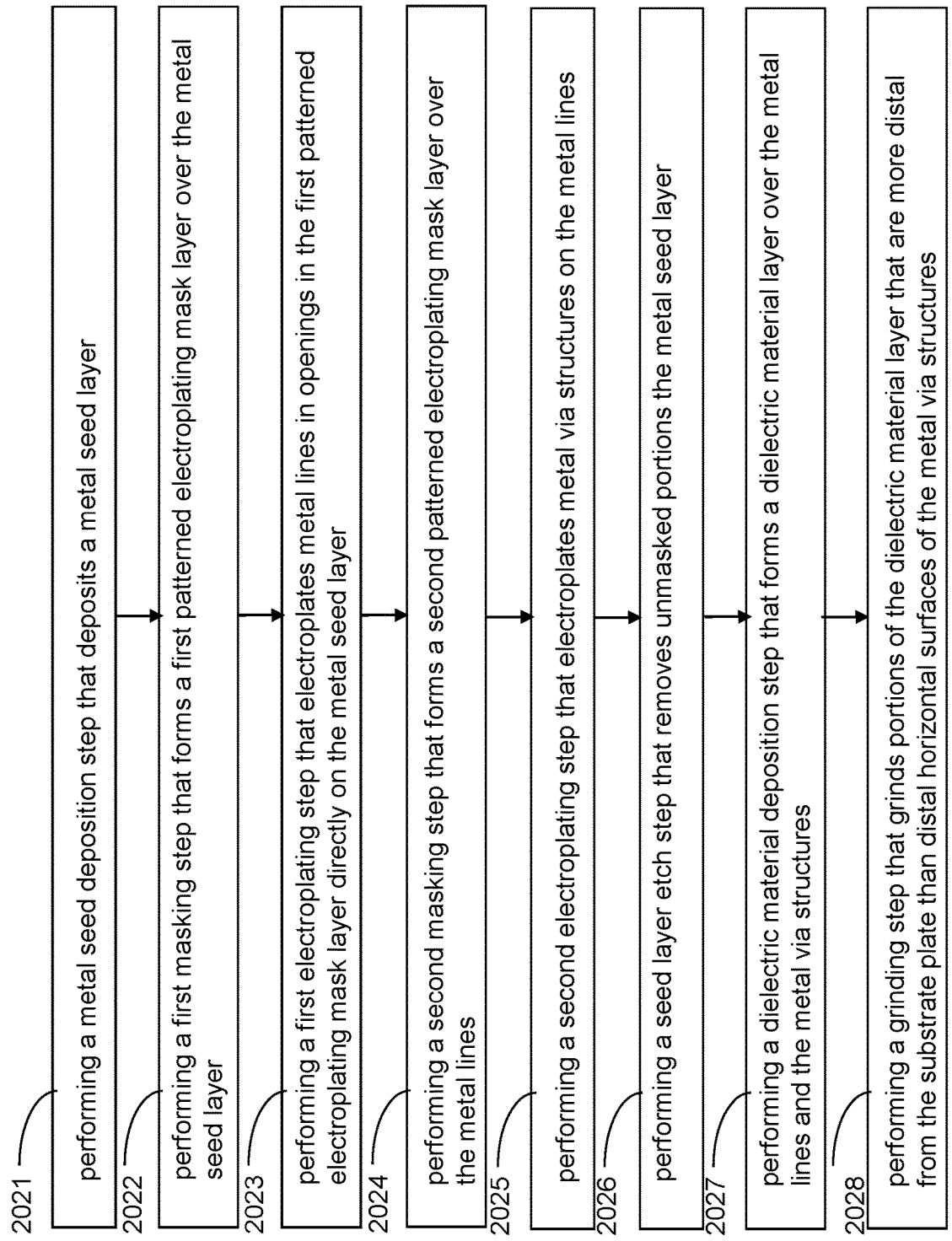
FIG. 21 is a flow chart illustrating a unit sequence of processing steps for forming an interconnect-level structure according to an embodiment of the present disclosure.

Referring to FIG. 21, a flow chart illustrates a unit sequence of processing steps for forming an interconnect-level structure (100, 200) according to an embodiment of the present disclosure.

Referring to step 2021 and FIGS. 4 and 13, a metal seed deposition step may be performed that deposits a metal seed layer (such as a first copper seed layer (111L or 211L)).

Referring to step 2022 and FIGS. 5A and 5B and 13, a first masking step may be performed, which forms a first patterned electroplating mask layer (131 or 231) over the metal seed layer (111L or 211L).

Referring to step 2023 and FIGS. 5A and 5B and 13, a first electroplating step may be performed, which electroplates metal lines (120, 220) in openings in the first patterned electroplating mask layer (131 or 231) directly on the metal seed layer (111L or 211L).

Referring to step 2024 and FIGS. 7, 8A and 8B, 13, 18, and 19, a second masking step may be performed, which forms a second patterned electroplating mask layer (132, 232) over the metal lines (120, 220).

Referring to step 2025 and FIGS. 8A and 8B, 13, and 19, a second electroplating step may be performed, which electroplates metal via structures (140, 240) on the metal lines (120, 220).

Referring to step 2026 and FIGS. 6, 13, and 19, a seed layer etch step may be performed, which removes unmasked portions of the metal seed layer (111L or 211L). In some embodiments, the seed layer etch step may be performed after step 2023 and prior to step 2024.

Referring to step 2027 and FIGS. 9, 10, and 13, a dielectric material deposition step may be performed, which forms a dielectric material layer (150, 250) over the metal lines (120, 220) and the metal via structures (140, 240).

Referring to step 2028 and FIGS. 11, 12, and 14-17C, a planarization step may be performed, which removes portions of the dielectric material layer (150, 250) that are more distal from the substrate plate 10 than distal horizontal surfaces of the metal via structures (140, 240).

Figure 22:
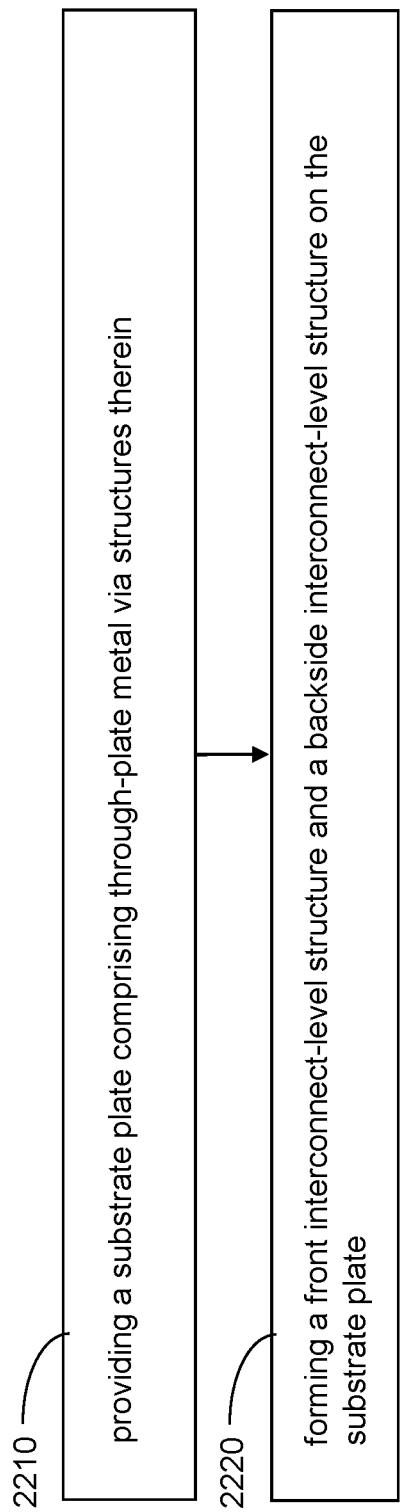
FIG. 22 is a second flow chart illustrating steps for forming a packaging substrate according to an embodiment of the present disclosure.

Referring to FIG. 22, a second flow chart illustrates steps for forming a packaging substrate according to an embodiment of the present disclosure.

Referring to step 2210 and FIGS. 1A-3, a substrate plate 10 comprising through-plate metal via structures (140, 240) therein is provided.

Referring to step 2220 and FIGS. 4-19, a front interconnect-level structure 100 and a backside interconnect-level structure 200 may be formed on the substrate plate 10.

Figure 23:
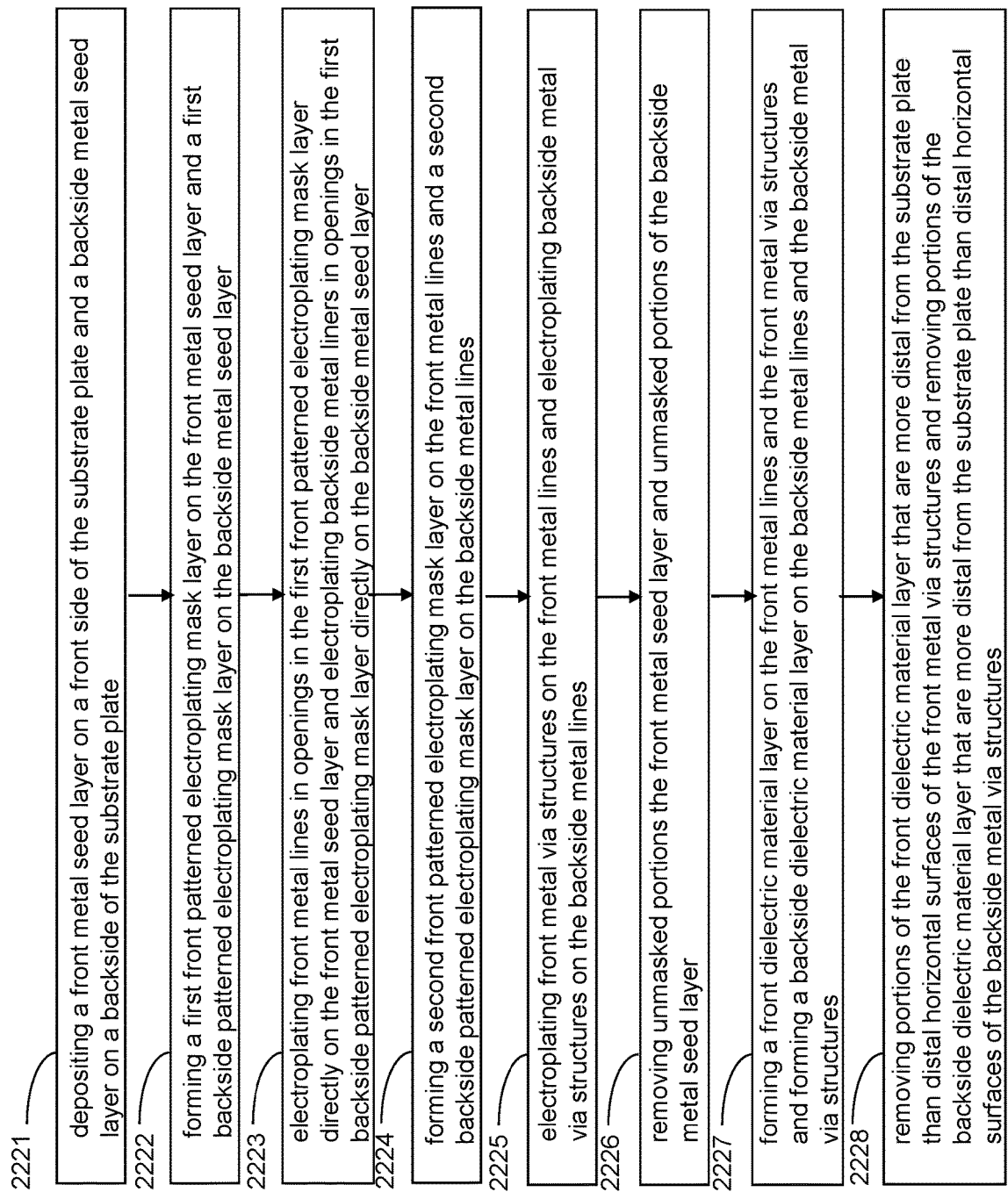
FIG. 23 is a flow chart illustrating a unit sequence of processing steps for forming a front interconnect-level structures and a backside interconnect-level structure according to an embodiment of the present disclosure.

Referring to FIG. 23, a flow chart illustrating a unit sequence of processing steps for forming a front interconnect-level structure 100 and a backside interconnect-level structure 200 according to an embodiment of the present disclosure.

Referring to step 2221 and FIGS. 4 and 13, a front metal seed layer (such as a first front metal seed layer 111L) may be deposited on a front side of the substrate plate and a backside metal seed layer (such as a first backside metal seed layer 211L) may be deposited on a backside of a substrate plate 10.

Referring to step 2222 and FIGS. 5A and 5B and 13, a first front patterned electroplating mask layer 131 may be formed on the front metal seed layer and a first backside patterned electroplating mask layer 231 may be formed on the backside metal seed layer.

Referring to step 2223 and FIGS. 5A and 5B and 13, front metal lines 120 may be electroplated in openings in the first front patterned electroplating mask layer 131 directly on the front metal seed layer, and backside metal lines 220 may be electroplated in openings in the first backside patterned electroplating mask layer 231 directly on the backside metal seed layer.

Referring to step 2224 and FIGS. 7, 8A and 8B, 13, 18, and 19, a second front patterned electroplating mask layer may be formed on the front metal lines 120, and a second backside patterned electroplating mask layer may be formed on the backside metal lines 220.

Referring to step 2225 and FIGS. 8A and 8B, 13, and 19, front metal via structures 140 may be electroplated on the front metal lines 120, and backside metal via structures 240 may be electroplated on the backside metal lines 220.

Referring to step 2226 and FIGS. 6, 13, and 19, unmasked portions the front metal seed layer and unmasked portions of the backside metal seed layer may be removed.

Referring to step 2227 and FIGS. 9, 10, and 13, a front dielectric material layer 150 may be formed on the front metal lines 120 and the front metal via structures 140, a backside dielectric material layer 250 may be formed on the backside metal lines 220 and the backside metal via structures 240.

Referring to step 2228 and FIGS. 11, 12, and 14-17C, portions of the front dielectric material layer 150 that are more distal from the substrate plate 10 than distal horizontal surfaces of the front metal via structures 140 may be removed, and portions of the backside dielectric material layer 250 that are more distal from the substrate plate than distal horizontal surfaces of the backside metal via structures 240 may be removed.

Referring to all drawings and according to various embodiments of the present disclosure, a packaging substrate is provided, which comprises: a substrate plate comprising through-plate holes 9 therethrough; through-plate metal via structures (140, 240) (e.g., copper via structures) vertically extending through the through-plate holes 9; one or more front interconnect-level structures 100 located on a front side of the substrate plate 10; and one or more backside interconnect-level structures 200 located on a backside of the substrate plate 10, wherein: at least one interconnect-level structure (100, 200) selected from the one or more front interconnect-level structures 100 and the one or more backside interconnect-level structures 200 comprises a respective set of elements that comprises: a dielectric material layer (150, 250) having a proximal horizontal dielectric surface located within a first horizontal plane and having a distal horizontal dielectric surface located within a second horizontal plane; metal lines (120, 220) having a respective proximal horizontal surface located entirely within the first horizontal plane and having a respective distal horizontal surface located between the first horizontal plane and the second horizontal plane; and metal via structures (140, 240) having a respective proximal horizontal surface in contact with a distal horizontal surface of a respective one of the metal lines (120, 220) and having a respective distal horizontal surface located entirely within the second horizontal plane.

In one embodiment, each interface between an adjoined pair of a metal line (120, 220) and a metal via structure (140, 240) among the metal lines (120, 220) and the metal via structures (140, 240) is a copper-to-metal interface defined by a continuous horizontally-extending grain boundary having a root mean square surface roughness that is less than an average grain size of metal grains within the metal lines (120, 220) and the metal via structure.

In one embodiment, within each adjoined pair of a metal line (120, 220) and a metal via structure (140, 240) among the metal lines (120, 220) and the metal via structures (140, 240), an area of the metal via structure (140, 240) is located entirely within an area of the metal line (120, 220) in a plan view, and a periphery of the metal via structure (140, 240) is laterally offset inward from a periphery of the metal line (120, 220) structure in the plan view.

In one embodiment, an entirety of the dielectric material layer (150, 250) has a homogeneous composition throughout; and the dielectric material layer (150, 250) extends continuously as a single continuous material portion, and is free of any seam or any internal interface therein.

In one embodiment, the one or more front interconnect-level structures 100 comprise a plurality of front interconnect-level structures 100; the one or more backside interconnect-level structures 200 comprise a plurality of backside interconnect-level structures 200; each of the plurality of front interconnect-level structures 100 and the plurality of backside interconnect-level structures 200 comprises a respective dielectric material layer (150, 250), a respective set of metal lines (120, 220), and a respective set of metal via structures (140, 240); front bonding pads are provided on an outermost one of the plurality of front interconnect-level structures 100; and backside bonding pads are provided on an outermost one of the plurality of backside interconnect-level structures 200.

The various embodiments of the present disclosure provide methods for forming a packaging substrate without using any laser drilling process. According to the methods of the present disclosure, the aspect ratio of metal via structures (e.g., copper) (140, 240) may be reduced relative to the aspect ratios of metal via structures in packaging substrates in related arts. Thus, the structural integrity of the metal via structures (140, 240) may be enhanced. Further, the methods of the present disclosure reduce the total processing cost for manufacture of packaging substrates by avoiding expensive laser drilling processes. The mechanical accuracy limit for laser drilling processes is moot because the laser drilling processes are not used in the methods of the present disclosure. Thus, small metal via structures (140, 240) having lateral dimensions (such as diameters) less than 30 microns, and/or less than 10 microns, may be manufactured using the methods of the present disclosure. Queue time limitations associated with laser drilling processes are moot upon elimination of laser drilling processes. Thus, the methods of the present disclosure may be used to manufacture packaging substrates at a lower cost with less technical limitations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a packaging substrate, the method comprising:
    providing a substrate plate comprising through-plate metal via structures therein; and
    forming interconnect-level structures on the substrate plate by performing a unit an ordered sequence of processing steps that comprises:
        a metal seed deposition step that deposits a metal seed layer;
        a first masking step that forms a first patterned electroplating mask layer over the metal seed layer;
        a first electroplating step that electroplates metal lines in openings in the first patterned electroplating mask layer directly on the metal seed layer;
        a second masking step that forms a second patterned electroplating mask layer comprising openings over the metal lines;
        a second electroplating step that electroplates metal via structures on the metal lines;
        a seed layer etch step that removes unmasked portions of the metal seed layer;
        a dielectric material deposition step that forms a dielectric material layer over the metal lines and the metal via structures; and
        a planarization step that removes portions of the dielectric material layer that are more distal from the substrate plate than distal horizontal surfaces of the metal via structures.

2. The method of claim 1, wherein each opening in the second patterned electroplating mask layer is formed entirely within an area of a respective one of the metal lines in a plan view.

3. The method of claim 1, wherein the metal seed deposition step deposits the metal seed layer on physically exposed surfaces of metal portions attached to the substrate plate.

4. The method of claim 3, wherein the physically exposed surfaces of the metal portions attached to the substrate plate comprise physically exposed surface of the through-plate metal via structures.

5. The method of claim 3, wherein the physically exposed surfaces of the metal portions attached to the substrate plate comprise physically exposed surfaces of underlying metal via structures that are formed in a previously performed unit sequence of processing steps.

6. The method of claim 1, wherein the unmasked portions of the metal seed layer comprise all portions of the metal seed layer that do not have an areal overlap with the metal lines.

7. The method of claim 1, wherein:
each of the metal via structures comprises a respective physically exposed distal surface after performing the grinding step; and
each of the physically exposed distal surfaces of the metal via structures is located within a same horizontal plane as a distal surface of a remaining portion of the dielectric material layer after performing the grinding step.

8. The method of claim 1, wherein the metal seed deposition step that deposits the metal seed layer comprises a metal electroless plating process.

9. The method of claim 1, wherein the first patterned electroplating mask layer is formed by:
attaching a first dry film including a first photoresist material layer to the metal seed layer; and
lithographically exposing and developing the first photoresist material layer.

10. The method of claim 9, wherein the second patterned electroplating mask layer is formed by:
attaching a second dry film including a second photoresist material layer to the metal lines and to a dielectric surface that underlies the metal lines; and
lithographically exposing and developing the second photoresist material layer.

11. A method of forming a packaging substrate, the method comprising:
providing a substrate plate comprising through-plate copper via structures therein; and
forming a front interconnect-level structures and a backside interconnect-level structure on the substrate plate by sequentially performing an ordered sequence of processing steps that comprises:
depositing a front copper seed layer on a front side of the substrate plate and a backside copper seed layer on a backside of the substrate plate;
forming a first front patterned electroplating mask layer on the front copper seed layer and a first backside patterned electroplating mask layer on the backside copper seed layer;
electroplating front copper lines in openings in the first front patterned electroplating mask layer directly on the front copper seed layer and electroplating backside copper lines in openings in the first backside patterned electroplating mask layer directly on the backside copper seed layer;
forming a second front patterned electroplating mask layer comprising front openings on the front copper lines and a second backside patterned electroplating mask layer comprising backside opening on the backside copper lines;
electroplating front copper via structures on the front copper lines and electroplating backside copper via structures on the backside copper lines;
removing unmasked portions the front copper seed layer and unmasked portions of the backside copper seed layer;
forming a front dielectric material layer on the front copper lines and the front copper via structures and forming a backside dielectric material layer on the backside copper lines and the backside copper via structures; and
removing portions of the front dielectric material layer that are more distal from the substrate plate than distal horizontal surfaces of the front copper via structures and removing portions of the backside dielectric material layer that are more distal from the substrate plate than distal horizontal surfaces of the backside copper via structures.

12. The method of claim 11, wherein:
during said forming of the second front patterned electroplating mask layer, each front opening in the second front patterned electroplating mask layer is formed entirely within an area of a respective one of the front copper lines in a plan view; and
during said forming of the second backside patterned electroplating mask layer, each backside opening in the second backside patterned electroplating mask layer is formed entirely within an area of a respective one of the front copper lines in the plan view.

13. The method of claim 11, wherein:
the front copper seed layer is deposited on front surfaces of the through-plate copper via structures; and
the backside copper seed layer is deposited on backside surfaces of the through-plate copper via structures.

14. The method of claim 11, further comprising forming an additional front interconnect-level structure on the front side of the substrate plate and an additional backside interconnect-level structure on the backside of the substrate plate prior to formation of the front interconnect-level structure and the backside interconnect-level structure, wherein:
the additional front interconnect-level structure comprises additional front copper via structures;
the additional backside interconnect-level structure comprises additional backside copper via structures;
the front copper seed layer is deposited on the additional front copper via structures; and
the backside copper seed layer is deposited on the additional backside copper via structures.

15. The method of claim 11, wherein
the front copper seed layer is deposited on a front patterned surface in which discrete front copper surfaces are exposed within a first horizontal plane including a front surface of a front dielectric material layer; and
the backside copper seed layer is deposited on a backside patterned surface in which discrete backside copper surfaces are exposed within a second horizontal plane including a backside surface of a backside dielectric material layer.

16. A method of forming a packaging substrate, the method comprising:
providing a substrate plate comprising through-plate metal via structures therein; and
forming interconnect-level structures on the substrate plate, wherein the interconnect-level structures comprise front interconnect-level structures and backside interconnect-level structures,
wherein the interconnect-level structures are formed by performing an ordered sequence of processing steps that comprises:
a metal seed deposition step that deposits a metal seed layer;
a first masking step that forms a first patterned electroplating mask layer over the metal seed layer;
a first electroplating step that electroplates metal lines in openings in the first patterned electroplating mask layer directly on the metal seed layer;
a second masking step that forms a second patterned electroplating mask layer comprising openings over the metal lines;
a second electroplating step that electroplates metal via structures on the metal lines; a seed layer etch step that removes unmasked portions of the metal seed layer;

a dielectric material deposition step that forms a dielectric material layer over the metal lines and the metal via structures; and a planarization step that removes portions of the dielectric material layer that are more distal from the substrate plate than distal horizontal surfaces of the metal via structures.

17. The method of claim 16, wherein the metal lines comprise copper lines.

18. The method of claim 16, wherein:
each of the metal via structures comprises a respective physically exposed distal surface after performing the grinding step; and
each of the physically exposed distal surfaces of the metal via structures is located within a same horizontal plane as a distal surface of a remaining portion of the dielectric material layer after performing the grinding step.

19. The method of claim 16, wherein the metal seed deposition step that deposits the metal seed layer comprises a metal electroless plating process.

20. The method of claim 16, wherein the first patterned electroplating mask layer is formed by:
attaching a first dry film including a first photoresist material layer to the metal seed layer; and
lithographically exposing and developing the first photoresist material layer.

* * * * *